(12) United States Patent
Omori et al.

(10) Patent No.: US 9,972,413 B2
(45) Date of Patent: May 15, 2018

(54) METAL PARTICLE DISPERSION FOR ELECTROCONDUCTIVE SUBSTRATES, METHOD FOR PRODUCING THE SAME, AND METHOD FOR PRODUCING AN ELECTROCONDUCTIVE SUBSTRATE

(71) Applicant: DAI NIPPON PRINTING CO., LTD., Tokyo-to (JP)

(72) Inventors: Yoshinobu Omori, Tokyo-to (JP); Naonobu Yoshi, Tokyo-to (JP); Michihiro Ogura, Tokyo-to (JP); Tomoki Murata, Tokyo-to (JP); Mikiko Hojo, Tokyo-to (JP)

(73) Assignee: DAI NIPPON PRINTING CO., LTD., Tokyo-to (JP)

( * ) Notice: Subject to any disclaimer, the term of this patent is extended or adjusted under 35 U.S.C. 154(b) by 217 days.

(21) Appl. No.: 14/435,561

(22) PCT Filed: Oct. 10, 2013

(86) PCT No.: PCT/JP2013/077620
§ 371 (c)(1),
(2) Date: Apr. 14, 2015

(87) PCT Pub. No.: WO2014/061556
PCT Pub. Date: Apr. 24, 2014

(65) Prior Publication Data
US 2015/0279505 A1 Oct. 1, 2015

(30) Foreign Application Priority Data

Oct. 15, 2012 (JP) .................................. 2012-228389

(51) Int. Cl.
*H01B 1/22* (2006.01)
*H05K 3/12* (2006.01)
(Continued)

(52) U.S. Cl.
CPC ................. *H01B 1/22* (2013.01); *B05D 5/12* (2013.01); *C08F 26/10* (2013.01); *C08F 226/10* (2013.01); *C09D 11/52* (2013.01); *C09D 139/06* (2013.01); *H05K 1/097* (2013.01); *H05K 3/10* (2013.01); *H05K 3/1283* (2013.01); *H05K 3/22* (2013.01); *C08F 220/18* (2013.01); *H05K 2203/1126* (2013.01); *H05K 2203/1142* (2013.01); *H05K 2203/1168* (2013.01)

(58) Field of Classification Search
CPC ... H01B 1/20; H01B 1/22; C09D 5/24; C09D 11/52; C09D 139/04; C09D 139/06; C09D 139/08; C09D 151/003; C09D 151/06; C09D 151/08; H05K 1/092; H05K 1/097; H05K 3/10; H05K 3/12; H05K 3/1283; H05K 3/1291; H05K 3/22; H05K 3/227; H05K 2203/1126; H05K 2203/1142; H05K 2203/1168; C08F 26/06; C08F 26/10; C08F 8/40; C08F 30/00; C08F 30/02; C08F 126/06; C08F 126/10; C08F 130/00; C08F 130/02; C08F 226/06; C08F 226/10; C08F 275/00; C08F 230/00; C08F 230/02; C08L 39/04; C08L 39/06; B05D 5/12
See application file for complete search history.

(56) References Cited

U.S. PATENT DOCUMENTS 4,146,489 A * 3/1979 Stambaugh ........... C08F 255/00
 44/337
6,329,472 B1 * 12/2001 Kim ......................... A61K 8/91
 424/70.1
(Continued)

FOREIGN PATENT DOCUMENTS

JP 2002-324966 A 11/2002
JP 2003049038 A * 2/2003
(Continued)

OTHER PUBLICATIONS

English machine translation of JP 2010-053171 A (2010).*
(Continued)

*Primary Examiner* — Harold Pyon
*Assistant Examiner* — Matthew R Diaz
(74) *Attorney, Agent, or Firm* — Ladas & Parry LLP

(57) ABSTRACT

The present invention is to provide a metal particle dispersion for electroconductive substrates, which has high dispersibility and dispersion stability and which is able to form a film that shows high electroconductivity after baking. Disclosed is a metal particle dispersion for electroconductive substrates, comprising metal particles, a dispersant and a solvent, wherein the dispersant is a graft copolymer having at least a constitutional unit represented by the following chemical formula (I) and a constitutional unit represented by the following chemical formula (II):

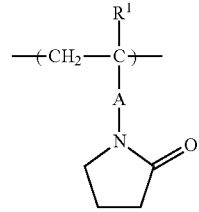

Chemical Formula (I)

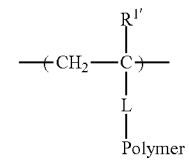

Chemical Formula (II)

(Symbols in the formulae are as described in the Description.)

16 Claims, 1 Drawing Sheet

(51) Int. Cl.
*C09D 11/52* (2014.01)
*C08F 26/10* (2006.01)
*C08F 226/10* (2006.01)
*C09D 139/06* (2006.01)
*B05D 5/12* (2006.01)
*H05K 3/10* (2006.01)
*H05K 3/22* (2006.01)
*H05K 1/09* (2006.01)
*C08F 220/18* (2006.01)

(56) References Cited

U.S. PATENT DOCUMENTS

| | | | | |
|---|---|---|---|---|
| 6,864,314 B1* | 3/2005 | Yeung | ............... | A61K 8/90 424/70.27 |
| 7,867,413 B2* | 1/2011 | Lee | ............... | B82Y 30/00 252/512 |
| 2006/0163744 A1* | 7/2006 | Vanheusden | ............... | B82Y 30/00 257/773 |
| 2009/0108241 A1* | 4/2009 | Ogura | ............... | G03F 7/033 252/586 |
| 2012/0267151 A1* | 10/2012 | Hojo | ............... | H05K 1/097 174/257 |

FOREIGN PATENT DOCUMENTS

| | | | |
|---|---|---|---|
| JP | 2002-166672 A | | 6/2006 |
| JP | 2008-127679 A | | 6/2008 |
| JP | 2010053171 A | * | 3/2010 |
| JP | 2011038028 A | * | 2/2011 |
| JP | 2013-129793 A | | 12/2013 |
| TW | 201100498 A | | 1/2011 |
| WO | 2011040189 A1 | | 4/2011 |

OTHER PUBLICATIONS

English machine translation of JP 2003-049038 A (2003).*
English machine translation of JP 2011-038028 A (2011).*
International Search Report Appln. No. PCT/JP2013/077620; dated Nov. 19, 2013.

* cited by examiner

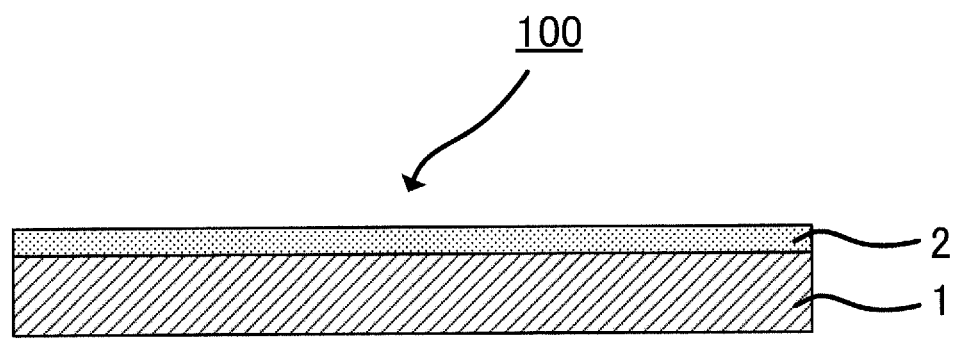

METAL PARTICLE DISPERSION FOR ELECTROCONDUCTIVE SUBSTRATES, METHOD FOR PRODUCING THE SAME, AND METHOD FOR PRODUCING AN ELECTROCONDUCTIVE SUBSTRATE

TECHNICAL FIELD

The present invention relates to a metal particle dispersion for electroconductive substrates, a method for producing the same, and a method for producing an electroconductive substrate.

BACKGROUND ART

Conventionally, for the production of a circuit board comprising a base material and electroconductive wirings formed thereon, various methods have been used, such as a method of applying a photoresist onto a metal foil attached to a base material, exposing the photoresist to light through a desired circuit pattern, and forming a pattern by chemical etching. In this photoresist method, a metal foil is used to form electroconductive wirings, so that an electroconductive substrate with a small volume resistivity and high performance can be produced. On the other hand, this method has disadvantages such that it requires many steps and is thus a complicated method, and it requires photoresist materials.

Recently, a circuit pattern forming method has attracted attention, which forms a circuit pattern by directly printing a pattern on a base material, using a metal particle dispersion having metal particles dispersed therein and by a printing process such as screen printing or inkjet printing, and then sintering the metal particles. Compared to conventional photoresist methods, etc., the method of directly printing a pattern on a base material can increase productivity dramatically higher.

For metal particles, it is known that the melting point is dramatically decreased by reducing the size. This is because as the particle diameter decreases, the specific surface area increases and thus the surface energy increases. By using this effect, the sintering of metal particles can be promoted at lower temperature than ever before. Accordingly, it has been expected that it would be possible to form circuits on resin base materials with low heat resistance, which have been difficult to use, by printing. However, as the particle diameter decreases, it is more difficult to prepare a dispersion with excellent dispersibility and dispersion stability.

In Patent Literature 1, a method of forming circuit patterns by inkjet printing and using an electroconductive metal paste is disclosed. In Patent Literature 1, to prevent ultrafine metal particles from direct contact with each other, a method of covering the ultrafine metal particles with a compound is disclosed, the compound having a group containing nitrogen, oxygen and sulfur atoms that are able to coordinately bind to metal elements contained in the ultrafine metal particles. In Patent Literature 1, alkylamine, alkanethiol, alkanediol and the like are provided as the compound having a group containing nitrogen, oxygen and sulfur atoms, which is used to coat the metal surface. In Patent Literature 1, a relatively low molecular weight compound having 4 to 20 carbon atoms is provided as a concrete example, so that the alkylamine and the like can be detached from the metal surface when the electroconductive metal paste is baked.

A metal-dispersed liquid is disclosed in Patent Literature 2, which contains metal particles having a mercaptocarboxylic acid and/or a salt thereof on the particle surface, a cationic surfactant and a non-aqueous solvent with low polarity. Patent Literature 2 describes that the mercaptocarboxylic acid or salt thereof on the metal particle surface is dissociated to be electrically negative in the solvent, and the mercaptocarboxylic acid ion is electrostatically bound to the cationic surfactant, thereby allowing the metal particles to maintain dispersion stability in the non-aqueous solvent with low polarity.

However, both the methods of Patent Literatures 1 and 2 disperse metal particles using a low molecular weight compound, and the dispersion stability of the metal particles is insufficient.

A metal microparticle dispersion is disclosed in Patent Literature 3, which contains a specific type of metal microparticles, a polymeric dispersant having a specific polyester skeleton, and a dispersion medium.

Patent Literature 3 describes that the specific polymeric dispersant have a high effect on the dispersibility of the metal microparticles and can be easily volatilized at a subsequent burning step. However, sufficient electroconductivity is not always obtained by the method of Patent Literature 3, when the stability of the metal microparticle dispersion is not sufficient or in the case of using metal oxide particles.

CITATION LIST

Patent Literature 1: Japanese Patent Application Laid-Open (JP-A) No. 2002-324966
Patent Literature 2: JP-A No. 2008-127679
Patent Literature 3: International Publication No. WO2011/040189

SUMMARY OF INVENTION

Technical Problem

In the case of dispersing metal particles by using a polymeric dispersant for increasing the dispersibility or dispersion stability of the metal particles, and especially in the case where the metal particles are baked at a low temperature or for a short time, the polymeric dispersant may remain in the resulting metal film and increase the volume resistivity of an electroconductive substrate, so that the thus-obtained electroconductive substrate may not exhibit sufficient performance. On the other hand, in the case of decreasing the amount of the dispersant added or using a low molecular weight dispersant for inhibiting the remaining of dispersant, the dispersibility and dispersion stability of the metal particles become insufficient.

Accordingly, it has been quite difficult to obtain a dispersion which has high dispersibility and dispersion stability and which is able to form a film that shows electroconductivity after baking. In the case of using fine metal particles having an oxidized surface or in the case of using fine metal oxide particles, it often happens that high electroconductivity cannot be obtained even when baking the fine particles. Accordingly, even in the case of using such fine particles, it has been desired to obtain a dispersion which is able to form a film that shows high electroconductivity after baking.

The present invention was achieved in light of the above circumstances. An object of the present invention is to provide: a metal particle dispersion for electroconductive substrates, which has high dispersibility and dispersion stability and which is able to form a film that shows high electroconductivity after baking; a method for producing the metal particle dispersion; and a method for producing an electroconductive substrate, which provides an electroconductive substrate with excellent electroconductivity.

Solution to Problem

To achieve the above object, the inventors of the present invention made diligent research and have found that by using metal particles in combination with a specific dispersant, it is possible to obtain excellent dispersibility and dispersion stability and to form a film that shows high electroconductivity even when baked at a low temperature or for a short time.

The present invention was completed based on this finding.

The metal particle dispersion for electroconductive substrates according to the present invention comprises metal particles, a dispersant and a solvent, wherein the dispersant is a graft copolymer having at least a constitutional unit represented by the following chemical formula (I) and a constitutional unit represented by the following chemical formula (II):

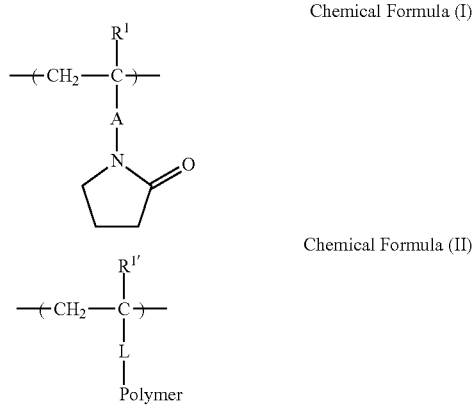

Chemical Formula (I)

Chemical Formula (II)

wherein $R^1$ and $R^{1'}$ are each independently a hydrogen atom or a methyl group; "A" is a direct bond or a divalent linking group; "L" is a direct bond or a divalent linking group; and "Polymer" is a polymer chain having at least one constitutional unit represented by the following chemical formula (IV) or (V):

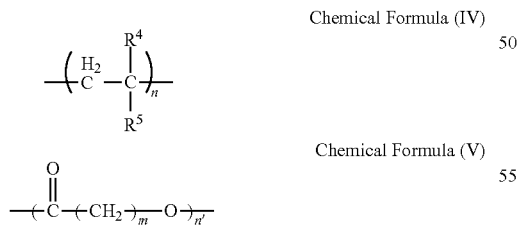

Chemical Formula (IV)

Chemical Formula (V)

wherein $R^4$ is a hydrogen atom or a methyl group; $R^5$ is a hydrocarbon group, a cyano group or a monovalent group represented by $—[CH(R^6)—CH(R^7)—O]_x—R^8$, $—[(CH_2)_y—O]_z—R^8$, $—[CO—(CH_2)_y—O]_z—R^8$, $—CO—O—R^9$ or $—O—CO—R^{10}$; $R^6$ and $R^7$ are each independently a hydrogen atom or a methyl group;

$R^8$ is a hydrogen atom, a hydrocarbon group or a monovalent group represented by $—CHO$, $—CH_2CHO$ or $—CH_2COOR^{11}$; $R^9$ is a hydrocarbon group, a cyano group or a monovalent group represented by $—[CH(R^6)—CH(R^7)—O]_x—R^8$, $—[(CH_2)_y—O]_z—R^8$ or $—[CO—(CH_2)_y—O]_z—R^8$; $R^{10}$ is an alkyl group having 1 to 18 carbon atoms; $R^{11}$ is a hydrogen atom or an alkyl group having 1 to 5 carbon atoms;

the hydrocarbon group can have a substituent group;

m is an integer of 1 to 5; n and n' are each an integer of 5 to 200; x is an integer of 1 to 18; y is an integer of 1 to 5; and z is an integer of 1 to 18.

The method for producing a metal particle dispersion for electroconductive substrates according to the present invention, comprises the steps of: preparing a dispersant by preparing a graft copolymer in which at least a monomer represented by the following chemical formula (I') and a polymerizable oligomer comprising a polymer chain having at least one constitutional unit represented by the following chemical formula (IV) or (V) and a group having an ethylenically unsaturated double bond at a terminal of the chain, are contained as copolymerizable components, and dispersing the thus-obtained dispersant and metal particles in a solvent:

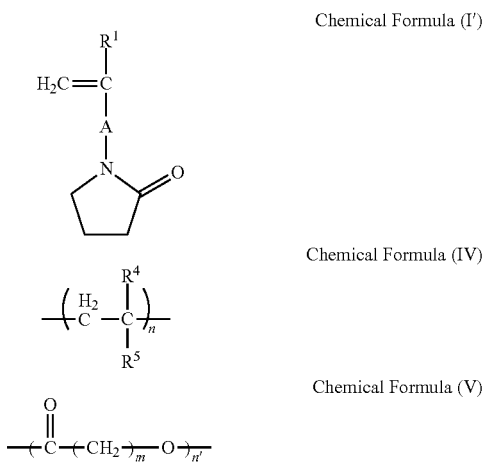

Chemical Formula (I')

Chemical Formula (IV)

Chemical Formula (V)

wherein $R^1$ is a hydrogen atom or a methyl group; "A" is a direct bond or a divalent linking group;

wherein $R^4$ is a hydrogen atom or a methyl group; $R^5$ is a hydrocarbon group, a cyano group or a monovalent group represented by $—[CH(R^6)—CH(R^7)—O]_x—R^8$, $—[(CH_2)_y—O]_z—R^8$, $—[CO—(CH_2)_y—O]_z—R^8$, $—CO—O—R^9$ or $—O—CO—R^{10}$; $R^6$ and $R^7$ are each independently a hydrogen atom or a methyl group;

$R^8$ is a hydrogen atom, a hydrocarbon group or a monovalent group represented by $—CHO$, $—CH_2CHO$ or $—CH_2COOR^{11}$; $R^9$ is a hydrocarbon group, a cyano group or a monovalent group represented by $—[CH(R^6)—CH(R^7)—O]_x—R^8$, $—[(CH_2)_y—O]_z—R^8$ or $—[CO—(CH_2)_y—O]_z—R^8$; $R^{10}$ is an alkyl group having 1 to 18 carbon atoms; $R^{11}$ is a hydrogen atom or an alkyl group having 1 to 5 carbon atoms;

the hydrocarbon group can have a substituent group;

m is an integer of 1 to 5; n and n' are each an integer of 5 to 200; x is an integer of 1 to 18; y is an integer of 1 to 5; and z is an integer of 1 to 18.

The method for producing an electroconductive substrate according to the present invention comprises the steps of: forming a coating film by applying, onto a base material, a coating solution which contains a metal particle dispersion for electroconductive substrates, comprising metal particles, a dispersant and a solvent, wherein the dispersant is a graft copolymer having at least a constitutional unit represented by the chemical formula (I) and a constitutional unit represented by the chemical formula (II), and baking the coating film.

In the metal particle dispersion for electroconductive substrates, the method for producing the same, and the method for producing an electroconductive substrate according to the present invention, the graft copolymer as the dispersant preferably further has a constitutional unit represented by the following chemical formula (III), from the point of view that excellent dispersibility and dispersion stability can be obtained, and an electroconductive substrate with excellent electroconductivity can be easily obtained.

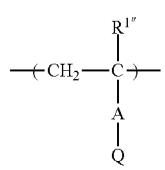

Chemical Formula (III)

In the chemical formula (III), $R^{1''}$ is a hydrogen atom or a methyl group; "A" is a direct bond or a divalent linking group; and "Q" is a group represented by the following chemical formula (III-a) or a nitrogen-containing heterocyclic group which is able to form a salt with an acid or a halogenated hydrocarbon:

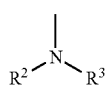

Chemical Formula (III-a)

wherein $R^2$ and $R^3$ are each independently a hydrogen atom or a hydrocarbon group which can contain a heteroatom; the hydrocarbon group can have a substituent group; and $R^2$ and $R^3$ can be the same as or different from each other.

In the metal particle dispersion for electroconductive substrates, the method for producing the same, and the method for producing an electroconductive substrate according to the present invention, it is preferable that in the graft copolymer as the dispersant, a salt is formed between at least a part of a nitrogen site contained in the constitutional unit represented by the chemical formula (III) and at least one selected from the group consisting of an acidic phosphorus compound, a sulfonic acid compound and a halogenated hydrocarbon, from the point of view that excellent dispersibility and dispersion stability can be obtained and an electroconductive substrate with excellent electroconductivity can be easily obtained.

In the metal particle dispersion for electroconductive substrates, the method for producing the same, and the method for producing an electroconductive substrate according to the present invention, it is preferable that in the dispersant, the acidic phosphorus compound is a compound represented by the following chemical formula (VI); the sulfonic acid compound is a compound represented by the following chemical formula (VII); and the halogenated hydrocarbon is one or more selected from the group consisting of a halogenated benzyl, a halogenated allyl and a halogenated methyl, from the point of view that excellent dispersibility and dispersion stability can be obtained and an electroconductive substrate with excellent electroconductivity can be obtained:

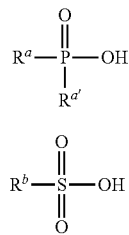

Chemical Formula (VI)

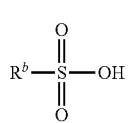

Chemical Formula (VII)

wherein $R^a$ and $R^{a'}$ are each independently a hydrogen atom, a hydroxyl group, a hydrocarbon group or a monovalent group represented by —[CH($R^c$)—CH($R^d$)—O]$_s$—$R^e$, —[(CH$_2$)$_t$—O]$_u$—$R^e$ or —O—$R^{a''}$; $R^{a''}$ is a hydrocarbon group or a monovalent group represented by —[CH($R^c$)—CH($R^d$)—O]$_s$—$R^e$, —[(CH$_2$)$_t$—O]$_u$—$R^e$, —C($R^f$)($R^g$)—C($R^h$)($R^i$)—OH or —CH$_2$—C($R^j$)($R^k$)—CH$_2$—OH;

$R^b$ is a hydrocarbon group or a monovalent group represented by —[CH($R^c$)—CH($R^d$)—O]$_s$—$R^e$, —[(CH$_2$)$_t$—O]$_u$—$R^e$ or —O—$R^{b'}$; $R^{b'}$ is a hydrocarbon group or a monovalent group represented by —[CH($R^c$)—CH($R^d$)—O]$_s$—$R^e$ or —[(CH$_2$)$_t$—O]$_u$—$R^e$;

$R^c$ and $R^d$ are each independently a hydrogen atom or a methyl group; $R^e$ is a hydrogen atom, a hydrocarbon group or a monovalent group represented by —CHO, —CH$_2$CHO, —CO—CH=CH$_2$, —CO—C(CH$_3$)=CH$_2$ or —CH$_2$COOR$^{e'}$; $R^{e'}$ is a hydrogen atom or an alkyl group having 1 to 5 carbon atoms; $R^f$, $R^g$, $R^h$, $R^i$, $R^j$ and $R^k$ are each independently a hydrogen atom, a hydrocarbon group or a group in which hydrocarbon groups are bound by at least one of an ether bond and an ester bond, and $R^f$ and $R^h$ can be bound to each other to form a cyclic structure; when the cyclic structure is formed, the cyclic structure can have a substituent group $R^1$, and $R^1$ is a hydrogen atom, a hydrocarbon group or a group in which hydrocarbon groups are bound by at least one of an ether bond and an ester bond;

the hydrocarbon group can have a substituent group;

s is an integer of 1 to 18; t is an integer of 1 to 5; and u is an integer of 1 to 18.

In the metal particle dispersion for electroconductive substrates, the method for producing the same, and the method for producing an electroconductive substrate according to the present invention, the metal particles are preferably metal particles containing one or more selected from the group consisting of gold, silver, copper and oxides thereof, from the viewpoint of electroconductivity.

In the method for producing an electroconductive substrate according to the present invention, the baking step is preferably a step of baking the coating film by irradiation with pulsed light, from the point of view that organic components in the resulting film can be easily decomposed and removed.

Advantageous Effects of Invention

According to the present invention, it is possible to obtain a metal particle dispersion for electroconductive substrates, which has high dispersibility and dispersion stability and which is able to form a film that shows high electroconductivity after baking, and a method for producing the metal particle dispersion, and a method for producing an electroconductive substrate, which provides an electroconductive substrate with excellent electroconductivity.

BRIEF DESCRIPTION OF DRAWINGS

FIG. 1 is a schematic view of an example of the electroconductive substrate obtained by the production method of the present invention.

DESCRIPTION OF EMBODIMENTS

Hereinafter, the metal particle dispersion for electroconductive substrates, the method for producing the same, and the method for producing an electroconductive substrate according to the present invention, will be described.

In the present invention, "light" encompasses electromagnetic waves with wavelengths in the visible and non-visible ranges. It further encompasses radial rays such as microwaves and electron beams. More specifically, it encompasses electromagnetic waves with wavelengths of 5 μm or less and electron beams. Also in the present invention, "(meth)acrylic" means any one of acrylic and methacrylic, and "(meth)acrylate" means any one of acrylate and methacrylate.

I. Metal Particle Dispersion for Electroconductive Substrates

The metal particle dispersion for electroconductive substrates according to the present invention comprises metal particles, a dispersant and a solvent, wherein the dispersant is a graft copolymer having at least a constitutional unit represented by the following chemical formula (I) and a constitutional unit represented by the following chemical formula (II):

Chemical Formula (I)

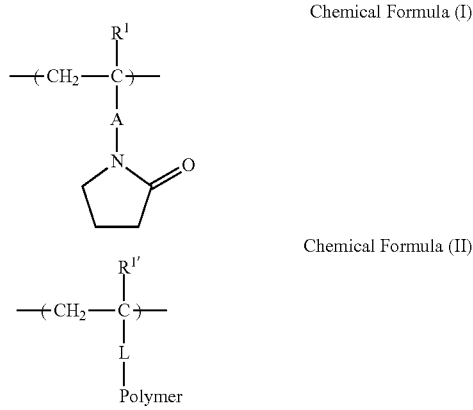

Chemical Formula (II)

wherein $R^1$ and $R^{1'}$ are each independently a hydrogen atom or a methyl group; "A" is a direct bond or a divalent linking group; "L" is a direct bond or a divalent linking group; and "Polymer" is a polymer chain having at least one constitutional unit represented by the following chemical formula (IV) or (V):

Chemical Formula (IV)

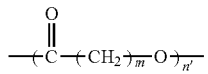

Chemical Formula (V)

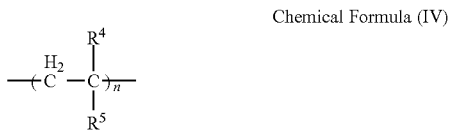

wherein $R^4$ is a hydrogen atom or a methyl group; $R^5$ is a hydrocarbon group, a cyano group or a monovalent group represented by $-[CH(R^6)-CH(R^7)-O]_x-R^8$, $-[(CH_2)_y-O]_z-R^8$, $-[CO-(CH_2)_y-O]_z-R^8$, $-CO-O-R^9$ or $-O-CO-R^{10}$; $R^6$ and $R^7$ are each independently a hydrogen atom or a methyl group;
$R^8$ is a hydrogen atom, a hydrocarbon group or a monovalent group represented by $-CHO$, $-CH_2CHO$ or $-CH_2COOR^{11}$; $R^9$ is a hydrocarbon group, a cyano group or a monovalent group represented by $-[CH(R^6)-CH(R^7)-O]_x-R^8$, $-[(CH_2)_y-O]_z-R^8$ or $-[CO-(CH_2)_y-O]_z-R^8$; $R^{10}$ is an alkyl group having 1 to 18 carbon atoms; $R^{11}$ is a hydrogen atom or an alkyl group having 1 to 5 carbon atoms;

the hydrocarbon group can have a substituent group;

m is an integer of 1 to 5; n and n' are each an integer of 5 to 200; x is an integer of 1 to 18; y is an integer of 1 to 5; and z is an integer of 1 to 18.

The mechanism that the effect as specified above is exerted by the above-specified combination, is not completely clear. However, it is presumed as follows.

Conventionally, relatively low molecular weight dispersants have been used in metal particle dispersions, for inhibiting the remaining of organic components after baking. However, in the case of using low molecular weight dispersants, insufficient dispersibility and dispersion stability are obtained. Especially, since metal particles have larger specific gravity than other components in dispersions and they are likely to precipitate, there is a problem that it is difficult to obtain excellent dispersibility and dispersion stability.

In the metal particle dispersion of the present invention, the metal particles are dispersed by using, as the dispersant, the copolymer having the constitutional unit represented by the chemical formula (I), which contains pyrrolidone, and the constitutional unit represented by the chemical formula (II), which contains the polymer chain having the specific structure at a side chain. Accordingly, while the pyrrolidone site in the dispersant adsorbs to the metal particle surface, the polymer chain as the side chain has solubility in solvent. Therefore, it is presumed that the dispersion of the metal particles is stabilized. As just described, since the above-specified dispersant surrounds the metal particles and is stably present in the solvent, it is presumed that the aggregation of the metal particles is less likely to occur and excellent dispersibility and dispersion stability are obtained.

Also, it is presumed that in the above-specified dispersant, the pyrrolidone site contained in the constitutional unit represented by the chemical formula (I) has reducing properties or an oxidation inhibiting effect. Since the site adsorbing to the metal particles has reducing properties or an oxidation inhibiting effect, even when baked for a short time, it is presumed that a reduction reaction is efficiently promoted or sintering is less likely to be inhibited by oxidation, thus making it possible to form a film that shows high electroconductivity after baking.

In addition, in the case of using the above-specified dispersant, organic components can be easily decomposed or removed from the film, even when baked at a low temperature of for a short time. Therefore, the dispersant is less likely to remain, and it is presumed that the thus-obtained metal film has a low volume resistivity and excellent electroconductivity. When the metal film can be obtained by baking at a low temperature or for a short time, there is such an advantage that the base material used to form the metal film thereon can be chosen from a wide range of options.

In addition, since the above-specified dispersant has the constitutional unit represented by the chemical formula (II), which has the polymer chain having the specific structure at a side chain, excellent dispersibility in organic solvents can be obtained. Therefore, for the electroconductive substrate, excellent coating properties can be obtained. When the coating properties are excellent, there is such an effect that problems (e.g., disconnection) are less likely to occur when the dispersion is used to form an electroconductive circuit.

In addition, since the above-specified dispersant can be controlled so as to have excellent reducing properties or an excellent oxidation inhibiting effect, an electroconductive substrate with excellent electroconductivity can be obtained even in the case of using metal particles such as core-shell particles in which the outermost surface is made of an oxide, or in the case of using metal particles such as metal oxide particles.

The metal particle dispersion for electroconductive substrates according to the present invention comprises at least the metal particles, the dispersant and the solvent. As long as the effects of the present invention are not deteriorated, it can contain other components as needed.

Hereinafter, the components of the metal particle dispersion for electroconductive substrates according to the present invention will be described in detail.

<Metal Particles>

In the present invention, the metal particles can be appropriately selected from various types of metal particles that show electroconductivity after baking. Examples of the metal types include gold, silver, copper, nickel, tin, iron, chromium, platinum, palladium, rhodium, iridium, ruthenium, osmium, indium, zinc, molybdenum, manganese, titanium and aluminum. In the present invention, "metal particles" encompass not only particles in a metal state but also particles in an alloy state, particles of a metal compound, etc. For example, "metal particles" can be particles each containing one or more selected from the group consisting of a metal, an alloy and a metal compound, such as the case where the surface of particles in a metal state is oxidized into a metal oxide, or the case where a core-shell structure is formed by two or more kinds of metals.

The metal particles are preferably metal particles containing one or more selected from the group consisting of gold, silver, copper, nickel and oxides thereof, and more preferably metal particles containing one or more selected from the group consisting of gold, silver, copper and oxides thereof, from the viewpoint of having high electroconductivity and easily maintaining the particles.

Examples of the metal compound include a metal oxide, a metal hydroxide and an organic metal compound. Preferably, these metal compounds are those that can be decomposed and put in a metal state when baked. Examples of metal compounds having silver include silver oxides and organic silver compounds. Examples of metal compounds having copper include copper oxides such as copper(I) oxide, copper(II) oxide and mixtures thereof.

Examples of the alloy include a copper-nickel alloy, a copper-tin alloy, a copper-manganese alloy, a silver-palladium alloy and a silver-copper alloy.

The surface of the metal particles can be coated with an organic protective agent.

The metal particles can be composed of one or more types of metal particles each containing one or more selected from the group consisting of the above-mentioned metals, alloys and metal compounds.

The method for preparing the metal particles can be appropriately selected from conventionally known methods. For example, the metal particles can be obtained by: physical methods of grinding metal powder by mechanochemical treatment, etc.; chemical dry methods such as a chemical vapor deposition (CVD) method, a vapor deposition method, a sputtering method, a thermal plasma method and a laser method; and chemical wet methods such as a thermal decomposition method, a chemical reduction method, an electrolysis method, a ultrasonication method, a laser ablation method, a supercritical fluid method and a microwave synthesis method.

For example, in the vapor deposition method, fine particles are produced by bringing a thermally evaporated metal vapor into contact with a low vapor pressure liquid containing a dispersant, under high vacuum.

An example of the chemical reduction method is a method of producing fine particles by mixing a metal oxide and a reducing agent in a solvent, in the presence of a complexing agent and an organic protective agent.

The complexing agent is such an agent that the donor atom of the ligand of the complexing agent binds to a metal ion or atom to form a metal complex compound. As the donor atom, a nitrogen atom, an oxygen atom and a sulfur atom are preferred. Examples of complexing agents in which the donor atom is a nitrogen atom include, but not limited to, amines and nitrogen-containing heterocyclic ring compounds such as imidazole and pyridine.

The organic protective agent is used to stabilize the dispersion of refined metal particles or to control the particle diameter. Concrete examples thereof include: protein-based organic protective agents such as gelatin, arabic gum and casein; natural polymers such as starch and dextrin; cellulose-based organic protective agents such as hydroxyethyl cellulose; and hydrophilic synthetic polymers such as polyvinyl alcohol. Also, the organic protective agent can be a relatively low molecular weight compound such as fatty acid or alkylamine. Among them, protein-based organic protective agents are preferred, from the viewpoint of dispersion stability.

In addition to the above methods, commercially-available metal particles can be appropriately used.

The average primary particle diameter of the metal particles can be appropriately determined, depending on the intended use. In general, it is determined in a range of 1 to 500 nm. From the point of view that excellent dispersibility and dispersion stability can be obtained and precipitates are less likely to occur, the average primary particle diameter of the metal particles is preferably 2 to 500 nm.

The average primary particle diameter of the metal particles can be obtained by the method of directly measuring the size of primary particles shown on an electron microscopy image. More specifically, the short-axis and long-axis diameters of each primary particle are measured, and the average was used as the particle diameter of each particle. Next, for 100 or more particles, the volume (mass) of each particle was obtained by approximating its volume (mass) by the volume (mass) of a cuboid with the above-obtained particle diameter, and the volume average particle diameter was obtained therefrom and used as the average particle diameter. The same result can be obtained by using any of a transmission electron microscope (TEM), scanning electron microscope (SEM) and scanning transmission electron microscope (STEM) as the electron microscope.

In the metal particle dispersion for electroconductive substrates according to the present invention, the content of the metal particles can be appropriately determined, depending on the intended use. From the viewpoint of dispersibility, the content is preferably in a range of 5 to 95% by mass, more preferably in a range of 20 to 90% by mass, with respect to the total solid content of the metal particle dispersion. In the present invention, by using the metal particles in combination with the below-described dispersant, excellent metal particle dispersibility and dispersion stability can be obtained and precipitates are less likely occur, even when the content of the metal particles is higher than ever before.

<Dispersant>

The dispersant used in the present invention is a graft copolymer having at least a constitutional unit represented by the following chemical formula (I) and a constitutional unit represented by the following chemical formula (II):

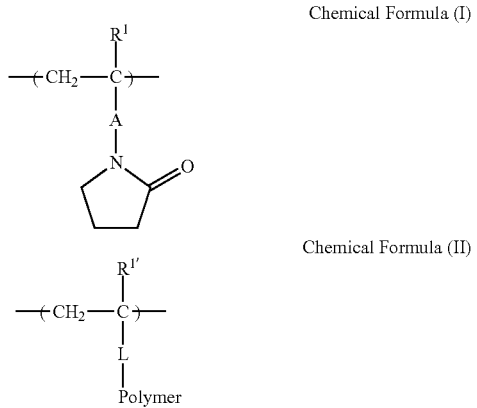

Chemical Formula (I)

Chemical Formula (II)

wherein $R^1$ and $R^{1'}$ are each independently a hydrogen atom or a methyl group; "A" is a direct bond or a divalent linking group; "L" is a direct bond or a divalent linking group; and "Polymer" is a polymer chain having at least one constitutional unit represented by the following chemical formula (IV) or (V):

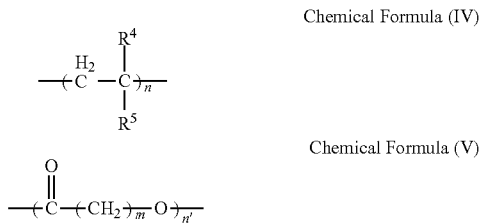

Chemical Formula (IV)

Chemical Formula (V)

wherein $R^4$ is a hydrogen atom or a methyl group; $R^5$ is a hydrocarbon group, a cyano group or a monovalent group represented by $-[CH(R^6)-CH(R^7)-O]_x-R^8$, $-[(CH_2)_y-O]_z-R^8$, $-[CO-(CH_2)_y-O]_z-R^8$, $-CO-O-R^9$ or $-O-CO-R^{10}$; $R^6$ and $R^7$ are each independently a hydrogen atom or a methyl group; $R^8$ is a hydrogen atom, a hydrocarbon group or a monovalent group represented by $-CHO$, $-CH_2CHO$ or $-CH_2COOR^{11}$; $R^9$ is a hydrocarbon group, a cyano group or a monovalent group represented by $-[CH(R^6)-CH(R^7)-O]_x-R^8$, $-[(CH_2)_y-O]_z-R^8$ or $-[-CO-(CH_2)_y-O]_z-R^8$; $R^{10}$ is an alkyl group having 1 to 18 carbon atoms; $R^{11}$ is a hydrogen atom or an alkyl group having 1 to 5 carbon atoms;

the hydrocarbon group can have a substituent group;

m is an integer of 1 to 5; n and n' are each an integer of 5 to 200; x is an integer of 1 to 18; y is an integer of 1 to 5; and z is an integer of 1 to 18.

In the present invention, while the constitutional unit represented by the chemical formula (I) and having the pyrrolidone site adsorbs to the metal particle surface, the polymer chain at a side chain of the constitutional unit represented by the chemical formula (II) has solubility in solvent. Therefore, the dispersion of the metal particles is stabilized, and increased dispersability and dispersion stability are obtained. Also in the dispersant, the pyrrolidone site adsorbing to the metal particle surface has reducing properties or an oxidation inhibiting effect. Therefore, even when baked for a short time, it is presumed that a reduction reaction is efficiently promoted or sintering is less likely to be inhibited by oxidation, thus making it possible to form a film that shows high electroconductivity after baking.

In the chemical formula (I), "A" is a direct bond or a divalent linking group. The direct bond means that the nitrogen atom of the pyrrolidone is directly bound to the carbon atom of the chemical formula (I), not through a linking group.

Examples of the divalent linking group as "A" include an alkylene group having 1 to 10 carbon atoms, an arylene group, a —CONH— group, a —COO— group, an ether group having 1 to 10 carbon atoms (—R'—OR"— wherein R' and R" are each independently an alkylene group) and combinations thereof.

In the chemical formula (I), "A" is preferably a direct bond, an alkylene group having 1 to 10 carbon atoms, or a divalent linking group containing a —COO— group.

In the chemical formula (II), "L" is a direct bond or a divalent linking group. The divalent linking group as "L" is not particularly limited, as long as it is able to link the ethylenically unsaturated double bond and the polymer chain to each other. Examples of the divalent linking group as "L" include an alkylene group, an alkylene group having a hydroxyl group, an arylene group, a —CONH— group, a —COO— group, a —NHCOO— group, an ether group (—O— group), a thioether group (—S— group) and combinations thereof. In the present invention, the binding direction of the divalent linking group can be any direction. For example, when —CONH— is contained in the divalent linking group, —CO can be located on the carbon atom side of the main chain and —NH can be located on the polymer chain side of the side chain. To the contrary, —NH can be located on the carbon atom side of the main chain and —CO can be located on the polymer chain side of the side chain.

In the chemical formula (II), "Polymer" is a polymer chain having at least one constitutional unit represented by the chemical formula (IV) or (V).

In the formula (IV), $R^4$ is a hydrogen atom or a methyl group, and $R^5$ is a hydrocarbon group, a cyano group or a monovalent group represented by $-[CH(R^6)-CH(R^7)-O]_x-R^8$, $-[(CH_2)_y-O]_z-R^8$, $-[CO-(CH_2)_y-O]_z-R^8$, $-CO-O-R^9$ or $-O-CO-R^{10}$.

The hydrocarbon group as $R^5$ is preferably an alkyl group having 1 to 18 carbon atoms, an alkenyl group having 2 to 18 carbon atoms, an aralkyl group or an aryl group.

The alkyl group having 1 to 18 carbon atoms can be linear, branched or cyclic. Examples thereof include a methyl group, an ethyl group, an n-propyl group, an isopropyl group, an n-butyl group, a cyclopentyl group, a cyclohexyl group, a bornyl group, an isobornyl group, a dicyclopentanyl group, an adamantyl group, and a lower alkyl group-substituted adamantyl group.

The alkenyl group having 2 to 18 carbon atoms can be linear, branched or cyclic. Examples of such an alkenyl group include a vinyl group, an allyl group and a propenyl group. The position of the double bond of the alkenyl group is not limited. From the viewpoint of the reactivity of the resulting polymer, the double bond is preferably located at the terminal of the alkenyl group.

Examples of the aryl group as $R^5$ include a phenyl group, a biphenyl group, a naphthyl group, a tolyl group and a xylyl group. The aryl group preferably has 6 to 24 carbon atoms, more preferably 6 to 12 carbon atoms.

Examples of the aralkyl group as $R^5$ include a benzyl group, a phenethyl group, a naphthylmethyl group and a biphenylmethyl group. The aralkyl group preferably has 7 to 20 carbon atoms, more preferably 7 to 14 carbon atoms.

$R^8$ is a hydrogen atom, an alkyl group having 1 to 18 carbon atoms, an aralkyl group, an aryl group or a monovalent group represented by —CHO, —CH$_2$CHO or —CH$_2$COOR$^{11}$. $R^9$ is an alkyl group having 1 to 18 carbon atoms, an aralkyl group, an aryl group, a cyano group or a monovalent group represented by —[CH(R$^6$)—CH(R$^7$)—O]$_x$—R$^8$, —[(CH$_2$)$_y$—O]$_z$—R$^8$ or —[—CO—(CH$_2$)$_y$—O]$_z$—R$^8$. $R^{10}$ is an alkyl group having 1 to 18 carbon atoms. $R^{11}$ is a hydrogen atom or an alkyl group having 1 to 5 carbon atoms.

The alkyl group having 1 to 18 carbon atoms, the aralkyl group and the aryl group as $R^8$ and $R^9$ are as described above in the description of $R^5$.

The alkyl group as $R^{10}$ and $R^{11}$ is as described above in the description of $R^5$.

When $R^5$, $R^8$, $R^9$ and $R^{10}$ are each a group having an aromatic ring, the aromatic ring can further have a substituent group. Examples of the substituent group include a linear, branched or cyclic alkyl group having 1 to 5 carbon atoms, an alkenyl group, a nitro group and a halogen atom such as F, Cl or Br.

The preferable number of carbon atoms does not include the number of the carbon atoms of the substituent group.

In $R^5$ and $R^9$, x is an integer of 1 to 18, preferably an integer of 1 to 4, more preferably an integer of 1 to 2; y is an integer of 1 to 5, preferably an integer of 1 to 4, more preferably 2 or 3; z is an integer of 1 to 18, preferably an integer of 1 to 4, more preferably an integer of 1 to 2.

Also, $R^5$, $R^8$, $R^9$ and $R^{10}$ can be further substituted with a substituent group such as an alkoxy group, a hydroxyl group, a carboxyl group, an amino group, an epoxy group, an isocyanate group or a hydrogen bond-forming group, to the extent that does not deteriorate the dispersing performance or the like of the graft copolymer.

Of the above-mentioned constitutional units, the polymer chain contained in the constitutional unit represented by the chemical formula (II) preferably has a constitutional unit derived from, but not limited to, methyl(meth)acrylate, ethyl(meth)acrylate, isopropyl(meth)acrylate, n-butyl(meth)acrylate, isobutyl(meth)acrylate, tert-butyl(meth)acrylate, 2-ethylhexyl(meth)acrylate, 2-ethoxyethyl(meth)acrylate, cyclohexyl(meth)acrylate, benzyl(meth)acrylate, phenyl(meth)acrylate, isobornyl(meth)acrylate, dicyclopentanyl(meth)acrylate, adamantyl(meth)acrylate, styrene, α-methylstyrene, vinylcyclohexane, etc.

In the chemical formula (V), m is an integer of 1 to 5, preferably an integer of 2 to 5, more preferably an integer of 4 or 5. The unit numbers n and n' of the constitutional unit of the polymer chain can be each an integer of 5 to 200 and are not particularly limited. However, they are preferably in a range of 5 to 100.

In the present invention, as $R^5$ and $R^9$, it is preferable to use a group that has excellent solubility in the below-described solvent, and they can be appropriately selected depending on the solvent used for the metal particle dispersion. In particular, for example, when the solvent used is a solvent that is generally used for metal particle dispersions, such as an ether alcohol acetate-based solvent, an ether-based solvent or an ester-based solvent, preferred as $R^5$ and $R^9$ are a methyl group, an ethyl group, an isobutyl group, an n-butyl group, a 2-ethylhexyl group, a benzyl group, etc.

The reason why $R^5$ and $R^9$ are determined in this way is that excellent metal particle dispersibility and dispersion stability can be obtained when the constitutional unit containing $R^5$ or $R^9$ has solubility in the solvent and the pyrrolidone site has adsorption properties to metal particles.

Also, a branched alkyl group (e.g., isobutyl, isopropyl, 2-ethylhexyl) and a linear alkyl group (e.g., a methyl group, an n-butyl group) are preferred as $R^5$ and $R^9$, which are groups that can be easily and thermally decomposed when baked. Particularly preferred are branched and linear alkyl groups having 1 to 8 carbon atoms.

The mass average molecular weight Mw of the polymer chain as the Polymer is preferably in a range of 500 to 15,000, more preferably in a range of 1,000 to 8,000. When the mass average molecular weight is in the range, the dispersant can keep a sufficient steric repulsion effect, and an increase in the time required to disperse the metal particles can be inhibited by the steric effect.

As an indication, it is preferable that the polymer chain as the "Polymer" has a solubility of 50 (g/100 g solvent) or more at 23° C., in the solvent used in combination.

The solubility of the polymer chain can be determined by whether or not the material which is used for introducing the polymer chain when preparing the graft copolymer has the above solubility. For example, when a polymerizable oligomer containing a polymer chain and a group having an ethylenically unsaturated double bond at a terminal of the chain is used for introducing a polymer chain into the graft copolymer, the polymerizable oligomer is needed to have the above solubility. When a copolymer is formed by monomers each containing a group having an ethylenically unsaturated double bond, and then a polymer chain is introduced into the graft copolymer by a polymer chain having a reactive group that is reactive with the reactive group contained in the copolymer, the polymer chain having the reactive group is needed to have the solubility.

The polymer chain can be a homopolymer or copolymer. In the graft copolymer, the polymer chain contained in the constitutional unit represented by the chemical formula (II) can be one kind of polymer chain or a combination of two or more kinds of polymer chains.

It is preferable that the graft copolymer used in the present invention further has a constitutional unit represented by the following chemical formula (III), from the point of view that excellent dispersibility and dispersion stability can be obtained and an electroconductive substrate with excellent electroconductivity can be easily obtained:

Chemical Formula (III)

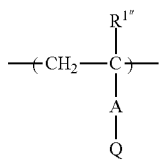

wherein $R^{1''}$ is a hydrogen atom or a methyl group; "A" is a direct bond or a divalent linking group; and "Q" is a group represented by the following chemical formula (III-a) or a nitrogen-containing heterocyclic group which is able to form a salt with an acid or a halogenated hydrocarbon:

Chemical Formula (III-a)

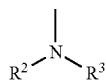

wherein $R^2$ and $R^3$ are each independently a hydrogen atom or a hydrocarbon group which can contain a heteroatom; the hydrocarbon group can have a substituent group; and $R^2$ and $R^3$ can be the same as or different from each other.

In the chemical formula (III), "A" is a direct bond or a divalent linking group. The direct bond means that, as shown in the following chemical formula (III-1), "Q" is directly bound to a carbon atom, not through a linking group:

Chemical Formula (III-1)

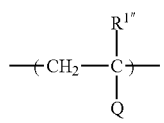

wherein $R^{1''}$ and "Q" are the same as the chemical formula (III).

Examples of the divalent linking group as "A" include an alkylene group having 1 to 10 carbon atoms, an arylene group, a —CONH— group, a —COO— group, an ether group having 1 to 10 carbon atoms (—R'—OR"— wherein R' and R" are each independently an alkylene group) and combinations thereof.

In the chemical formula (III), "A" is preferably a direct bond or a divalent linking group containing a —CONH— group or a —COO— group.

For example, when "A" is a divalent linking group containing a —COO— group and "Q" is a group represented by the chemical formula (III-a), the constitutional unit represented by the chemical formula (III) can be a structure represented by the following formula (III-2), for example:

Chemical Formula (III-2)

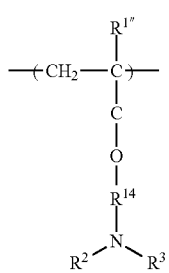

wherein $R^{1''}$ is the same as the chemical formula (III); $R^2$ and $R^3$ are the same as the chemical formula (III-a); $R^{14}$ is an alkylene group having 1 to 8 carbon atoms, —[CH($R^{15}$)—CH($R^{16}$)—O]$_x$—CH($R^{15}$)—CH($R^{16}$)— or —[(CH$_2$)$_y$—O]$_z$—(CH$_2$)$_y$—; $R^{15}$ and $R^{16}$ are each independently a hydrogen atom or a methyl group; x is an integer of 1 to 18; y is an integer of 1 to 5; and z is an integer of 1 to 18.

The alkylene group having 1 to 8 carbon atoms as $R^{14}$ can be linear or branched. Examples thereof include a methylene group, an ethylene group, a trimethylene group, a propylene group, various kinds of butylene groups, various kinds of pentylene groups, various kinds of hexylene groups and various kinds of octylene groups.

$R^{15}$ and $R^{16}$ are each independently a hydrogen atom or a methyl group.

In $R^{14}$, x, y and z are as described above in the description of $R^5$.

From the viewpoint of dispersibility, $R^{14}$ is preferably an alkylene group having 1 to 8 carbon atoms, more preferably a methylene group, an ethylene group, a propylene group or a butylene group, still more preferably a methylene group or an ethylene group.

In the chemical formula (III-a), examples of the hydrocarbon group which can contain a heteroatom as $R^2$ and $R^3$ include an alkyl group, an aralkyl group and an aryl group.

Examples of the alkyl group include a methyl group, an ethyl group, a propyl group, a butyl group, an isopropyl group, a tert-butyl group, a 2-ethylhexyl group, a cyclopentyl group and a cyclohexyl group. The alkyl group preferably has 1 to 18 carbon atoms. More preferably, the alkyl group is a methyl group or an ethyl group.

Examples of the aralkyl group include a benzyl group, phenethyl group, naphthylmethyl group and a biphenylmethyl group. The aralkyl group preferably has 7 to 20 carbon atoms, more preferably 7 to 14 carbon atoms.

Examples of the aryl group include a phenyl group, a biphenyl group, a naphthyl group, a tolyl group and a xylyl group. The aryl group preferably has 6 to 24 carbon atoms, more preferably 6 to 12 carbon atoms. The preferable number of carbon atoms does not include the number of the carbon atoms of the substituent group.

The hydrocarbon group containing a heteroatom has such a structure that the carbon atom in the hydrocarbon group is substituted with a heteroatom. Examples of the heteroatom which can be contained in the hydrocarbon group include an oxygen atom, a nitrogen atom, a sulfur atom and a silicon atom.

The hydrogen atom in the hydrocarbon group can be substituted with an alkyl group having 1 to 5 carbon atoms or a halogen atom such as a fluorine atom, a chlorine atom or a bromine atom.

"Q" can be a nitrogen-containing heterocyclic group which is able to form a salt with an acid or a halogenated hydrocarbon. The nitrogen-containing heterocyclic group can be selected from 5 to 7-membered nitrogen-containing mono-heterocyclic rings and condensed rings thereof. It can further have a different heteroatom or a substituent group. The nitrogen-containing heterocyclic group can have aromaticity.

Concrete examples of nitrogen-containing heterocyclic compounds which is able to form the nitrogen-containing heterocyclic group include pyridine, piperidine, piperazine, morpholine, pyrrolidine, pyrroline, imidazole, pyrazole, triazole, tetrazole and benzimidazole. In particular, the nitrogen-containing heterocyclic compound is preferably a nitrogen-containing heterocyclic compound containing only a nitrogen atom as the heteroatom, such as pyridine, piperidine, piperazine or imidazole. It is more preferably a nitrogen-containing heterocyclic group with aromaticity, such as pyridine or imidazole.

Examples of the substituent group that the nitrogen-containing heterocyclic group can have include a linear, branched or cyclic alkyl group having 1 to 12 carbon atoms, an aralkyl group, an aryl group and a halogen atom such as F, Cl or Br. These examples can be used in combination. The substitution position of the substituent group and the number of the substituent group(s) are not particularly limited.

Examples of the constitutional unit represented by the chemical formula (III) include, but not limited to, constitutional units derived from: nitrogen-containing (meth)acrylates such as dimethylaminoethyl(meth)acrylate, dimethylaminopropyl(meth)acrylate, diethylaminoethyl(meth)acrylate, diethylaminopropyl(meth)acrylate and pentamethylpiperidyl(meth)acrylate; nitrogen-containing vinyl monomers such as vinylimidazole and vinylpyridine; and acrylamide-based monomers such as dimethylaminopropylacrylamide.

The constitutional unit represented by the chemical formula (III) can be one kind of constitutional unit or a combination of two or more kinds of constitutional units.

For the graft copolymer, it is preferable to appropriately select the constitutional unit represented by the chemical formula (I), depending on the type of metal particles to be dispersed. From the viewpoint of dispersibility, dispersion stability and electroconductivity, the constitutional unit represented by the chemical formula (I) is preferably 3 to 80% by mass of the total constitutional units, more preferably 5 to 50% by mass, still more preferably 10 to 40% by mass. Also, it is preferable to appropriately select the constitutional unit represented by the chemical formula (II), depending on the type of metal particles to be dispersed. From the viewpoint of dispersibility, dispersion stability and electroconductivity, the content ratio of the constitutional unit represented by the chemical formula (II) is preferably 3 to 80% by mass, more preferably 5 to 50% by mass, still more preferably 10 to 40% by mass of the total constitutional units.

When a constitutional unit containing a nitrogen site represented by the chemical formula (III) is contained, it is preferable to appropriately select the constitutional unit, depending on the type of metal particles to be dispersed. From the viewpoint of dispersibility, dispersion stability and electroconductivity, the content ratio of the constitutional unit is preferably 3 to 80% by mass, more preferably 5 to 50% by mass, still more preferably 10 to 40% by mass of the total constitutional units.

The content ratios of the constitutional units can be calculated from the amounts of the constitutional units used to synthesize the graft copolymer.

The weight average molecular weight Mw of the graft copolymer is preferably in a range of 1,000 to 100,000, more preferably in a range of 3,000 to 30,000, still more preferably in a range of 5,000 to 20,000. The metal particles can be uniformly dispersed when the weight average molecular weight is in the range.

The weight average molecular weight Mw is a value measured by gel permeation chromatography (GPC). The measurement was carried out by using HLC-8120GPC manufactured by Tosoh Corporation and the following: the elution solvent used is N-methylpyrrolidone mixed with 0.01 mol/l lithium bromide; the polystyrene standards for calibration curve used are Mw 377400, 210500, 96000, 50400, 20650, 10850, 5460, 2930, 1300 and 580 (the Easi PS-2 series manufactured by Polymer Laboratories) and Mw 1090000 (manufactured by Tosoh Corporation); and the measurement columns used are two TSK-GEL ALPHA-M columns (manufactured by Tosoh Corporation).

In the present invention, the method for producing the graft copolymer is not particularly limited, as long as it is a method that is able to produce a graft copolymer having the constitutional unit represented by the chemical formula (I) and the constitutional unit represented by the chemical formula (II). For example, there may be mentioned a method for producing a graft copolymer by copolymerizing at least a monomer represented by the following chemical formula (I') and a polymerizable oligomer comprising a polymer chain having at least one constitutional unit, represented by the chemical formula (IV) or (V) and a group having an ethylenically unsaturated double bond at a terminal of the chain, which are contained as copolymerizable components. As needed, the graft copolymer can be produced by further incorporating other monomer as a copolymerizable component, such as a monomer represented by the following chemical formula (III'), and by using a known polymerization method.

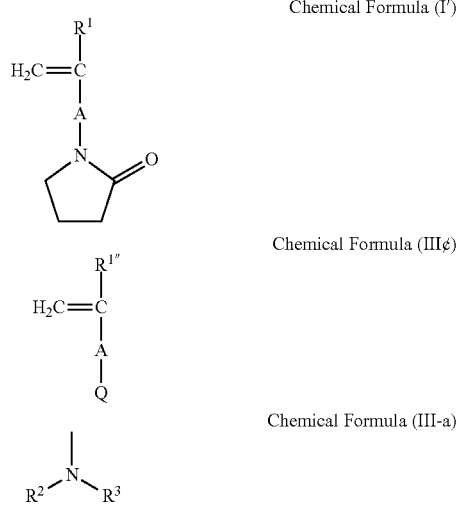

Chemical Formula (I')

Chemical Formula (III')

Chemical Formula (III-a)

In the chemical formula (I'), $R^1$ is a hydrogen atom or a methyl group, and "A" is a direct bond or a divalent linking group.

In the chemical formula (III'), $R^{1''}$ is a hydrogen atom or a methyl group; "A" is a direct bond or a divalent linking group; and "Q" is a group represented by the chemical formula (III-a) or a nitrogen-containing heterocyclic group which is able to form a salt with an acid or a halogenated hydrocarbon.

Examples of the monomer which is represented by the chemical formula (I') and derives the constitutional unit represented by the chemical formula (I) include, but not limited to, N-vinylpyrrolidone, 1-allyl-2-pyrrolidone, 3-(2-oxopyrrolizino)propyl methacrylate, 4-(2-oxopyrrolizino) butyl methacrylate, 5-(2-pyrrolidone-1-yl)pentyl methacrylate, 2-(5-methyl-2-pyrrolidone-1-yl)ethyl methacrylate, 2-methyl-2-(2-oxo-1-pyrrolidinyl)propyl methacrylate, and 1-[2-(vinyloxy)ethyl]-2-pyrrolidone.

The polymerizable oligomer as described above can be an appropriately synthesized polymerizable oligomer or a commercially-available product. Examples of the commercially-available product include a single terminal methacryloylated polymethylmethacrylate oligomer (mass average molecular weight 6,000, "AA-6" (product name) manufactured by TOAGOSEI Co., Ltd.), a single terminal methacryloylated poly-n-butylacrylate oligomer (mass average molecular weight 6,000, "AB-6" (product name) manufactured by TOAGOSEI Co., Ltd.), a single terminal methacryloylated polystyrene oligomer (mass average molecular weight 6,000, "AS-6" (product name) manufactured by TOAGOSEI Co., Ltd.), a caprolactone-modified hydroxyethyl methacrylate ("PLACCEL FM5" (product name) manufactured by DAICEL Chemical Industries, Ltd.) and a caprolactone-modified hydroxyethyl acrylate ("PLACCEL FA10L" (product name) manufactured by DAICEL Chemical Industries, Ltd.)

Well-known methods for synthesizing such a polymerizable oligomer include a living polymerization method and a radical polymerization method using a chain transfer agent. The radical polymerization method is easier to use since it allows more flexibility in monomer selection. For example, an oligomer having a carboxyl group at the single terminal can be obtained by radical polymerization of a monomer in the presence of a chain transfer agent having a carboxyl group, such as mercaptopropionic acid. By adding glycidyl methacrylate to this oligomer, an oligomer having a methacryloyl group at the single terminal, that is, a polymerizable oligomer can be obtained.

Also, after a copolymer is formed by addition polymerization of at least the monomer represented by the chemical formula (I') and a monomer containing a reactive group and a group having an ethylenically unsaturated double bond, a polymer chain can be introduced into the copolymer by using a polymer chain containing a reactive group that is reactive with the reactive group contained in the copolymer. In particular, for example, after a copolymer having a substituent group such as an alkoxy group, a hydroxyl group, a carboxyl group, an amino group, an epoxy group, an isocyanate group or a hydrogen bond-forming group is synthesized, a polymer chain can be introduced into the copolymer by reacting the substituent group with a polymer chain containing a functional group that is reactive with the substituent group.

For example, a polymer chain can be introduced by reacting a copolymer having a carboxyl group at a side chain thereof with a polymer chain having a glycidyl group at the terminal thereof, or by reacting a copolymer having an isocyanate group at a side chain thereof with a polymer chain having a hydroxy group at the terminal thereof.

In the polymerization, additives that are generally used for polymerization, such as a polymerization initiator, a dispersion stabilizer and a chain transfer agent, can be used.

When the graft copolymer as the dispersant contains the constitutional unit represented by the chemical formula (III), it is preferable that in the graft copolymer, a salt is formed between at least a part of a nitrogen site contained in the constitutional unit represented by the chemical formula (III) and at least one selected from the group consisting of an acidic phosphorus compound, a sulfonic acid compound and a halogenated hydrocarbon, from the point of view that excellent dispersibility and dispersion stability can be obtained and an electroconductive substrate with excellent electroconductivity can be easily obtained.

By using at least one selected from the group consisting of an acidic phosphorus compound, a sulfonic acid compound and a halogenated hydrocarbon as a salt-forming agent, the dispersant can be a dispersant which has excellent metal particle dispersibility and dispersion stability and which can be easily volatilized or decomposed when baked.

(Acidic Phosphorus Compound)

As the acidic phosphorus compound, there may be mentioned an acidic organophosphorus compound, phosphinic acid, phosphonic acid, etc. The acidic phosphorus compound is particularly preferably a phosphate compound represented by the following chemical formula (VI):

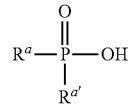

Chemical Formula (VI)

wherein $R^a$ and $R^{a'}$ are each independently a hydrogen atom, a hydroxyl group, a hydrocarbon group or a monovalent group represented by —[CH($R^c$)—CH($R^d$)—O]$_s$—$R^e$, —[(CH$_2$)$_t$—O]$_u$—$R^e$ or —O—$R^{a''}$; $R^{a''}$ is a hydrocarbon group or a monovalent group represented by —[CH($R^c$)—CH($R^d$)—O]$_s$—$R^e$, —[(CH$_2$)$_t$—O]$_u$—$R^e$, —C($R^f$)($R^g$)—C($R^h$)($R^i$)—OH or —CH$_2$—C($R^j$)($R^k$)—CH$_2$—OH;

$R^c$ and $R^d$ are each independently a hydrogen atom or a methyl group; $R^e$ is a hydrogen atom, a hydrocarbon group or a monovalent group represented by —CHO, —CH$_2$CHO, —CO—CH=CH$_2$, —CO—C(CH$_3$)=CH$_2$ or —CH$_2$COOR$^{e'}$; $R^{e'}$ is a hydrogen atom or an alkyl group having 1 to 5 carbon atoms; $R^f$, $R^g$, $R^h$, $R^i$, $R^j$ and $R^k$ are each independently a hydrogen atom, a hydrocarbon group or a group in which hydrocarbon groups are bound by at least one of an ether bond and an ester bond, and $R^f$ and $R^h$ can be bound to each other to form a cyclic structure; when the cyclic structure is formed, the cyclic structure can have a substituent group $R^1$, and $R^1$ is a hydrogen atom, a hydrocarbon group or a group in which hydrocarbon groups are bound by at least one of an ether bond and an ester bond;

the hydrocarbon group can have a substituent group; s is an integer of 1 to 18; t is an integer of 1 to 5; and u is an integer of 1 to 18.

Examples of the hydrocarbon group as $R^a$, $R^{a'}$, $R^{a''}$ and $R^e$ include an alkyl group having 1 to 18 carbon atoms, an alkenyl group having 2 to 18 carbon atoms, an aralkyl group and an aryl group. The alkyl group having 1 to 18 carbon atoms, the alkenyl group having 2 to 18 carbon atoms, the aralkyl group and the aryl group can be the same as those described above in the description of $R^5$ in the chemical formula (II).

The alkyl group or alkenyl group can have a substituent group. Examples of the substituent group include a halogen atom such as F, Cl or Br and a nitro group.

Examples of the substituent group of the aromatic ring of the aryl group, aralkyl group, etc., include a linear or branched alkyl group having 1 to 4 carbon atoms, an alkenyl group, a nitro group and a halogen atom.

In $R^a$, $R^{a'}$ and $R^{a''}$, s is an integer of 1 to 18; t is an integer of 1 to 5; and u is an integer of 1 to 18. Also, s is preferably an integer of 1 to 4, more preferably an integer of 1 to 2; t is preferably an integer of 1 to 4, more preferably 2 or 3; and u is preferably an integer of 1 to 4, more preferably an integer of 1 to 2.

The group in which hydrocarbon groups are bound by at least one of an ether bond and an ester bond, as $R^f$, $R^g$, $R^h$, $R^i$, $R^j$ and $R^k$, is a group represented by —R'—O—R", —R'—(C=O)—O—R" or —R'—O—(C=O)—R"

(wherein R' and R" are each a hydrocarbon group or a group in which hydrocarbon groups are bound by at least one of an ether bond and an ester bond). Two or more ether bonds and ester bonds can be contained per group. When the hydrocarbon group is monovalent, examples thereof include an alkyl group, an alkenyl group, an aralkyl group and an aryl group. When the hydrocarbon group is divalent, examples thereof include an alkylene group, an alkenylene group, an arylene group and combinations thereof.

In specific, the chemical formula (VI) in which $R^f$ and $R^h$ can be bound to each other to form a cyclic structure is represented by the following chemical formula (VI-1):

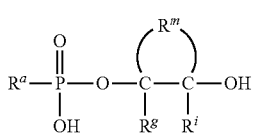

Chemical Formula (VI-1)

wherein $R^a$, $R^g$ and $R^i$ are the same as those described above in the description of the chemical formula (VI); and $R^m$ is a group in which $R^f$ and $R^h$ are bound to each other, and $R^m$ can further have a substituent group $R^1$.

When $R^f$ and $R^h$ are bound to each other to form a cyclic structure, the number of carbon atoms forming the cyclic structure is preferably 5 to 8. The number is more preferably 6, that is, the cyclic structure is more preferably a 6-membered ring structure.

The substituent group $R^1$ is a hydrocarbon group or a group in which hydrocarbon groups are bound by at least one of an ether bond and an ester bond. They can be the same as those described above in the description of $R^f$, $R^g$, $R^h$, $R^i$, $R^j$ and $R^k$.

The above-mentioned —C($R^f$)($R^g$)—C($R^h$)($R^i$)—OH or —CH$_2$—C($R^j$)($R^k$)—CH$_2$—OH can be obtained by, for example, reacting an acidic group (OH) of a phosphate group with a monofunctional epoxy compound or a monofunctional oxetane compound.

The phosphate compound represented by the chemical formula (VI) is preferably such that $R^a$ and $R^{a'}$ in the chemical formula (V) are each independently a hydrogen atom, hydroxyl group, a methyl group, an ethyl group, an aryl group or aralkyl group which can have a substituent group, a vinyl group, an allyl group or a monovalent group represented by —[CH($R^c$)—CH($R^d$)—O]$_s$—$R^e$, —[(CH$_2$)$_t$—O]$_u$—$R^e$ or —O—$R^{a'''}$; $R^{a'''}$ is a methyl group, an ethyl group, an aryl group or aralkyl group which can have a substituent group, a vinyl group, an allyl group, —[CH($R^c$)—CH($R^d$)—O]$_s$—$R^e$ or —[(CH$_2$)$_t$—O]$_u$—$R^e$; $R^c$ and $R^d$ are each independently a hydrogen atom or a methyl group; and $R^e$ is —CO—CH═CH$_2$ or —CO—C(CH$_3$)═CH$_2$, from the point of view that excellent metal particle dispersibility and dispersion stability can be obtained; precipitates can be inhibited; and the remaining of organic components can be inhibited after sintering.

Examples of the hydrocarbon group as $R^f$, $R^g$, $R^h$, $R^i$, $R^j$ and $R^k$ include an alkyl group having 1 to 18 carbon atoms, an alkenyl group having 2 to 18 carbon atoms, an aralkyl group and an aryl group. The alkyl group having 1 to 18 carbon atoms, the alkenyl group having 2 to 18 carbon atoms, the aralkyl group and the aryl group can be the same as those described above in the description of $R^5$ in the chemical formula (II).

(Sulfonic Acid Compound)

The sulfonic acid compound is particularly preferably a sulfonic acid compound represented by the chemical formula (VII):

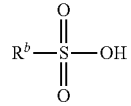

Chemical Formula (VII)

wherein $R^b$ is a hydrocarbon group or a monovalent group represented by —[CH($R^c$)—CH($R^d$)—O]$_s$—$R^e$, —[(CH$_2$)$_t$—O]$_u$—$R^e$ or —O—$R^{b'}$; $R^{b'}$ is a hydrocarbon group or a monovalent group represented by —[CH($R^c$)—CH($R^d$)—O]$_s$—$R^e$ or —[(CH$_2$)$_t$—O]$_u$—$R^e$;

$R^c$ and $R^d$ are each independently a hydrogen atom or a methyl group; $R^e$ is a hydrogen atom, a hydrocarbon group or a monovalent group represented by —CHO, —CH$_2$CHO, —CO—CH═CH$_2$, —CO—C(CH$_3$)═CH$_2$ or —CH$_2$COO$R^{e'}$; $R^{e'}$ is a hydrogen atom or an alkyl group having 1 to 5 carbon atoms;

the hydrocarbon group can have a substituent group;
s is an integer of 1 to 18; t is an integer of 1 to 5;
and u is an integer of 1 to 18.

The hydrocarbon group as $R^b$ and $R^{b'}$ can be the same as that described above in the description of $R^a$. Also, s, t and u in $R^b$ and $R^{b'}$ can be the same as those described above in the description of s, t and u in $R^a$.

The sulfonic acid compound represented by the chemical formula (VII) is preferably such that $R^b$ in the chemical formula (VII) is a methyl group, an ethyl group, an aryl group or aralkyl group which can have a substituent group, a vinyl group, an allyl group or a monovalent group represented by —[CH($R^c$)—CH($R^d$)—O]$_s$—$R^e$, —[(CH$_2$)$_t$—O]$_u$—$R^e$ or —O—$R^{b'}$; $R^{b'}$ is a methyl group, an ethyl group, an aryl group or aralkyl group which can have a substituent group, a vinyl group, an allyl group, —[CH($R^c$)—CH($R^d$)—O]$_s$—$R^e$ or —[(CH$_2$)$_t$—O]$_u$—$R^e$; $R^c$ and $R^d$ are each independently a hydrogen atom or a methyl group; and $R^e$ is —CO—CH═CH$_2$ or —CO—C(CH$_3$)═CH$_2$, from the point of view that excellent metal particle dispersibility and dispersion stability can be obtained; precipitates can be inhibited; and the remaining of organic components after sintering can be inhibited.

From the viewpoint of metal particle dispersibility, in the sulfonic acid compound represented by the chemical formula (VII), $R^b$ is preferably an aryl group or aralkyl group which can have a substituent group, more specifically, $R^b$ is preferably a benzyl group, a phenyl group, a tolyl group, a naphthyl group or a biphenyl group.

(Halogenated Hydrocarbon)

The halogenated hydrocarbon used in the present invention is able to form a salt with the nitrogen site of the constitutional unit represented by the chemical formula (III).

As the halogenated hydrocarbon, there may be mentioned one in which any one of a chlorine atom, a bromine atom and an iodine atom (halogen atoms) is substituted with a hydrogen atom of a saturated or unsaturated linear, branched or cyclic hydrocarbon. In particular, a halogenated hydrocarbon in which one of the hydrogen atoms of a hydrocarbon is substituted with a halogen atom is preferred, from the viewpoint of increasing metal particle dispersibility.

The halogenated hydrocarbon can be linear, branched or cyclic. Also, the halogenated hydrocarbon preferably has 1 to 18 carbon atoms, more preferably 1 to 7 carbon atoms.

The halogenated hydrocarbon can be a halogenated alkyl which has, but not limited to, 1 to 18 carbon atoms. Concrete examples thereof include methyl chloride, methyl bromide, ethyl chloride, ethyl bromide, methyl iodide, ethyl iodide, n-butyl chloride, hexyl chloride, octyl chloride, dodecyl chloride, tetradecyl chloride and hexadecyl chloride. Also, the halogenated hydrocarbon can be a halogenated allyl such as allyl chloride, allyl bromide and allyl iodide. Also, the halogenated hydrocarbon can be a halogenated aralkyl. The aralkyl group of the halogenated aralkyl can be an aralkyl group which has, but not limited to, 7 to 18 carbon atoms. Concrete examples thereof include benzyl chloride, benzyl bromide, benzyl iodide, naphthylmethyl chloride, pyridylmethyl chloride, naphthylmethyl bromide and pyridylmethyl bromide.

The halogenated hydrocarbon is particularly preferably at least one selected from the group consisting of a halogenated benzyl, a halogenated allyl and a halogenated methyl, from the point of view that a salt-forming reaction is easy to occur and the resulting salt-forming site has excellent adsorption properties to the metal particles.

In the polymer used in the present invention, the content of one or more selected from the group consisting of the acidic phosphorus compound, the sulfonic acid compound and the halogenated hydrocarbon is not particularly limited, as long as excellent dispersion stability can be obtained. With respect to the nitrogen site of the constitutional unit represented by the chemical formula (III), the content is about 0.01 to 4.0 molar equivalent, preferably 0.05 to 2.0 molar equivalent, more preferably 0.1 to 1.0 molar equivalent, from the point of view that metal particle dispersibility and dispersion stability can be increased; precipitates can be inhibited; and a metal film with less organic components remaining therein can be obtained. When two or more of the acidic phosphorus compound, the sulfonic acid compound and the halogenated hydrocarbon are used in combination, the total content is needed to be in the range.

<Method for Producing a Salt-Type Graft Copolymer>

The method for producing a salt-type graft copolymer which is used as the dispersant in the present invention is not particularly limited, as long as it is a method that is able to produce a polymer which has a constitutional unit represented by the chemical formula (III) and in which a salt is formed between at least part of the nitrogen site of the constitutional unit and one or more selected from the group consisting of the acidic phosphorus compound, the sulfonic acid compound and the halogenated hydrocarbon. In the present invention, for example, the salt-type graft copolymer can be produced as follows: a graft copolymer having a constitutional unit represented by the chemical formula (III) is polymerized by a known polymerization process; the graft copolymer is dissolved or dispersed in the below-described solvent; then, one or more selected from the group consisting of the acidic phosphorus compound, the sulfonic acid compound and the halogenated hydrocarbon are added to the solvent, followed by stirring (and heating as needed) the mixture, thereby producing the salt-type graft copolymer.

In the metal particle dispersion of the present invention, the polymer can be used alone as the dispersant, or two or more kinds of the polymers can be used in combination as the dispersant. The content is appropriately determined depending on the type and so on of the metal particles used. With respect to 100 parts by mass of the metal particles, the content is generally in a range of 0.1 to 100 parts by mass, preferably 1 to 50 parts by mass, more preferably 5 to 20 parts by mass. When the content of the dispersant is equal to or more than the lower limit, excellent metal particle dispersibility and dispersion stability can be obtained. When the content is equal to or less than the upper limit, the resulting film shows excellent electroconductivity after baking.

<Solvent>

In the metal particle dispersion of the present invention, the solvent is not particularly limited, as long as it is not reactive with the components in the metal particle dispersion and it is able to dissolve or disperse them. Concrete examples thereof include the following organic solvents: alcohol-based organic solvents such as methyl alcohol, ethyl alcohol, N-propyl alcohol and isopropyl alcohol; ether alcohol-based organic solvents such as methoxy alcohol, ethoxy alcohol, methoxy ethoxy ethanol, ethoxy ethoxy ethanol and propylene glycol monomethyl ether; ester-based organic solvents such as ethyl acetate, butyl acetate, 3-methoxybutyl acetate, methyl methoxypropionate, ethyl ethoxypropionate and ethyl lactate; ketone-based organic solvents such as acetone, methyl isobutyl ketone and cyclohexanone; ether alcohol acetate-based organic solvents such as methoxy ethyl acetate, methoxy propyl acetate, methoxy butyl acetate, ethoxy ethyl acetate, ethyl cellosolve acetate, methoxy ethoxy ethyl acetate, ethoxy ethoxy ethyl acetate and propylene glycol monomethyl ether acetate; ether-based organic solvents such as diethyl ether, ethylene glycol dimethyl ether, diethylene glycol dimethyl ether, diethylene glycol methyl ethyl ether and tetrahydrofuran; aprotic amide-based organic solvents such as N,N-dimethylformamide, N,N-dimethylacetamide and N-methylpyrrolidone; lactone-based organic solvents such as γ-butyrolactone; unsaturated hydrocarbon-based organic solvents such as benzene, toluene, xylene and naphthalene; and saturated hydrocarbon-based organic solvents such as n-heptane, n-hexane and n-octane.

Of them, from the viewpoint of coating properties, the following are preferably used: ether alcohol-based organic solvents such as propylene glycol monomethyl ether; ether alcohol acetate-based organic solvents such as methoxy ethyl acetate, ethoxy ethyl acetate, ethyl cellosolve acetate, methoxy ethoxy ethyl acetate, ethoxy ethoxy ethyl acetate and propylene glycol monomethyl ether acetate; ether-based organic solvents such as ethylene glycol dimethyl ether, diethylene glycol dimethyl ether, diethylene glycol methyl ethyl ether and propylene glycol diethyl ether; and ester-based organic solvents such as 3-methoxybutyl acetate, methyl methoxypropionate, ethyl ethoxypropionate and ethyl lactate.

Of them, from the viewpoint of the solubility and coating properties of the dispersant, the following are particularly preferred as the solvent used in the present invention: MBA (3-methoxybutyl acetate), PGMEA (propylene glycol monomethyl ether acetate), DMDG (diethylene glycol dimethyl ether), diethylene glycol methyl ethyl ether, PGME (propylene glycol monomethyl ether) and mixtures thereof.

In the metal particle dispersion of the present invention, the content of the solvent is not particularly limited, as long as the components of the metal particle dispersion can be uniformly dissolved or dispersed. In the present invention, the solid content of the metal particle dispersion is preferably in a range of 5 to 95% by mass, more preferably in a range of 20 to 90% by mass. When the solid content is in the range, a viscosity suitable for coating can be obtained.

<Other Components>

As needed, the metal particle dispersion of the present invention can contain other components, as long as the effect of the present invention is not deteriorated.

Examples of such components include a complexing agent, an organic protective agent, a reducing agent, a surfactant for increasing wettability, a silane coupling agent for increasing adhesion, a defoaming agent, a cissing inhibitor, an antioxidant, an aggregation inhibitor and a viscosity modifier. Also, the metal particle dispersion of the present invention can contain other dispersant, as long as the effect of the present invention is not deteriorated.

<Method for Producing a Metal Particle Dispersion>

In the present invention, the method for producing a metal particle dispersion is not particularly limited, as long as it is a method that is able to sufficiently disperse metal particles, and the method can be appropriately selected from conventionally known methods. In particular, for example, there may be mentioned, but not limited to, a production method comprising the steps of: preparing a dispersant by preparing a graft copolymer in which at least a monomer represented by the chemical formula (I') and a polymerizable oligomer comprising a polymer chain having at least one constitutional unit represented by the general formula (IV) or (V) and a group having an ethylenically unsaturated double bond at a terminal of the chain, are contained as copolymerizable components, and dispersing the thus-obtained dispersant and metal particles in a solvent.

A metal particle dispersion can be prepared by mixing the dispersant with the solvent, stirring the mixture to prepare a dispersant solution, mixing metal particles and, as needed, other components with the dispersant solution, and then dispersing the mixture with a conventionally known stirrer or disperser.

Examples of the disperser used to disperse the mixture include a ultrasonic disperser, roller mills such as a two roller mill and a three roller mill, an attritor, a banbury mixer, a paint shaker, a kneader, a homogenizer, a ball mill, a sand mill and a bead mill.

II. Method for Producing Electroconductive Substrate

The method for producing an electroconductive substrate according to the present invention comprises the steps of: forming a coating film by applying, onto a base material, a coating solution which contains a metal particle dispersion for electroconductive substrates, comprising metal particles, a dispersant and a solvent, wherein the dispersant is a graft copolymer having at least a constitutional unit represented by the following chemical formula (I) and a constitutional unit represented by the following chemical formula (II), and baking the coating film:

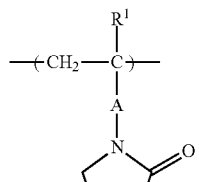

Chemical Formula (I)

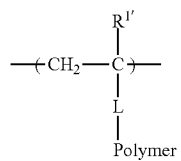

Chemical Formula (II)

wherein $R^1$ and $R^{1'}$ are each independently a hydrogen atom or a methyl group; "A" is a direct bond or a divalent linking group; "L" is a direct bond or a divalent linking group; and "Polymer" is a polymer chain having at least one constitutional unit represented by the following chemical formula (IV) or (V):

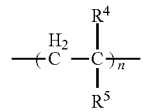

Chemical Formula (IV)

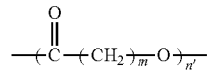

Chemical Formula (V)

wherein $R^4$ is a hydrogen atom or a methyl group; $R^5$ is a hydrocarbon group, a cyano group or a monovalent group represented by $-[CH(R^6)-CH(R^7)-O]_x-R^8$, $-[(CH_2)_y-O]_z-R^8$, $-[-CO-(CH_2)_y-O]_z-R^8$, $-CO-O-R^9$ or $-O-CO-R^{10}$; $R^6$ and $R^7$ are each independently a hydrogen atom or a methyl group;

$R^8$ is a hydrogen atom, a hydrocarbon group or a monovalent group represented by $-CHO$, a $-CH_2CHO$ or $-CH_2COOR^{11}$; $R^9$ is a hydrocarbon group, a cyano group or a monovalent group represented by $-[CH(R^6)-CH(R^7)-O]_x-R^8$, $-[(CH_2)_y-O]_z-R^8$ or $-[CO-(CH_2)_y-O]_z-R^8$; $R^{10}$ is an alkyl group having 1 to 18 carbon atoms; $R^{11}$ is a hydrogen atom or an alkyl group having 1 to 5 carbon atoms;

the hydrocarbon group can have a substituent group;

m is an integer of 1 to 5; n and n' are each an integer of 5 to 200; x is an integer of 1 to 18; y is an integer of 1 to 5; and z is an integer of 1 to 18.

According to the method for producing an electroconductive substrate according to the present invention, the metal particle dispersion used has excellent metal particle dispersibility and dispersion stability, and the dispersant contained therein has reducing properties and an oxidation inhibiting effect; therefore, an electroconductive substrate with excellent electroconductivity is obtained. Also, the metal particle dispersion used can control the solvent solubility of the dispersant in organic solvents and thus shows excellent coating properties on the base material; therefore, even when an electroconductive film is formed into a thin line such as a wiring, the electroconductive film does not cause disconnection and is able to secure excellent electroconductivity.

The method for producing an electroconductive substrate according to the present invention comprises at least the step of forming a coating film and the step of baking the coating film. As needed, the method can further comprise other steps, as long as the effect of the present invention is not deteriorated.

Hereinafter, the steps of the electroconductive substrate production method of the present invention will be described in order.

<The Step of Forming a Coating Film by Applying, onto a Base Material, a Coating Solution which Contains a Metal Particle Dispersion for Electroconductive Substrates>

This is a step of forming a coating film by applying, onto a base material, a coating solution which contains a metal particle dispersion for electroconductive substrates. Hereinafter, this step will be described in detail. The components of the metal particle dispersion for electroconductive substrates will not be described here, since they can be the same as those described above in the description of the metal particle dispersion for electroconductive substrates according to the present invention.

(Coating Solution which Contains a Metal Particle Dispersion for Electroconductive Substrates)

As the coating solution which contains a metal particle dispersion for electroconductive substrates, the metal particle dispersion for electroconductive substrates according to the present invention can be used as it is, or it can be mixed with a solvent and other components as needed and used as the coating solution.

As the solvent and other components, for example, the solvent described above in the description of the metal particle dispersion for electroconductive substrates according to the present invention, a surfactant, a silane coupling agent, a defoaming agent, a cissing inhibitor, an antioxidant, an aggregation inhibitor and a viscosity modifier can be used. In addition, a resin binder such as an acrylic resin binder or a polyester resin binder can be added from the viewpoint of film-forming properties, printing properties and dispersibility, as long as the effect of the present invention is not deteriorated.

(Base Material)

The base material used in the present invention can be appropriately selected from base materials used for electroconductive substrates, depending on the intended use. For example, glasses such as soda lime glass, alkali-free glass, borosilicate glass, high strain point glass and quartz glass, and inorganic materials such as alumina and silica can be used. Also, polymer materials and paper can be used. The metal particle dispersion for electroconductive substrates according to the present invention is able to form a metal film with excellent electroconductivity, even when it is baked at a lower temperature than ever before. Therefore, the metal particle dispersion of the present invention is applicable to soda lime glass and polymer materials, which have been difficult to use, and it is very useful in that it is applicable to resin films.

Examples of the resin films include films of polyimide, polyamide, polyamideimide, polyethylene terephthalate (PET), polyethylene naphthalate (PEN), polyphenylene sulfide, polyether ether ketone, polyethersulfone, polycarbonate, polyetherimide, epoxy resin, phenolic resin, glass-epoxy resin, polyphenylene ether, acrylic resin, polyolefins such as polyethylene and polypropylene, polycycloolefins such as polynorbornene, and liquid crystal polymer compounds.

In the case of forming a coating film of the metal particle dispersion in a pattern, a treatment for controlling the pattern shape or for imparting adhesion between the coating film and the base material can be carried out on the surface of the base material. The method for treating the base material surface can be appropriately selected from conventionally known methods. Concrete examples thereof include dry treatments such as a corona treatment, a UV treatment, a vacuum ultraviolet lamp treatment and a plasma treatment; a chemical treatment using an amine-based silane coupling agent, an imidazole-based silane coupling agent, a titanate coupling agent or an aluminum coupling agent; treatments for forming a porous film such as a porous silica film or a cellulose-based receptive layer; and treatments for forming a resin layer such as an active energy ray-curable resin layer, a thermosetting resin layer or a thermoplastic resin layer. By imparting liquid repellency to the base material surface by the treatment, when the coating film of the metal particle dispersion is formed in a pattern on the base material, the wetting and spreading of the coating solution on the base material surface can be inhibited, so that a highly precise pattern can be formed. Also, by forming an ink receptive layer such as a porous film on the base material surface, the solvent component penetrates into the layer and makes it possible to form a highly-precise pattern. To the contrary, by imparting lyophilic properties to the base material surface, the coating properties can be improved on the base material. These base material surface treatments can be appropriately selected and used depending on the intended use or purpose.

The form of the base material can be appropriately determined depending on the intended use. The base material can be in a flat plate form or a curved form. In general, the base material is in a flat plate form. In the case of using the base material in a flat plate form, the thickness of the base material can be appropriately determined depending on the intended use, and it can be about 10 µm to 1 mm, for example.

(Coating Method)

The method of applying the coating solution onto the base material can be appropriately selected from conventionally known methods. For example, there may be mentioned methods such as gravure printing, gravure offset printing, reverse offset printing, screen printing, spray coating, spin coating, comma coating, bar coating, knife coating, slot die coating, offset printing, flexographic printing, inkjet printing and dispenser printing. Of them, from the point of view that fine patterning can be carried out, preferred are gravure printing, gravure offset printing, reverse offset printing, flexographic printing, screen printing and inkjet printing. Particularly, because the metal particle dispersion used in the present invention has excellent dispersibility, it prevents discharge nozzles for inkjet from clogging and from causing discharge bending. Therefore, the metal particle dispersion used in the present invention can also be suitably used for inkjet printing.

After printing, the coating solution on the base material can be dried by a general method. The thickness of the printed area after drying can be appropriately controlled by changing the coating amount or the average primary particle diameter of the metal particles. It can be appropriately adjusted depending on the intended use. The thickness is generally in a range of 0.01 to 100 µm, preferably in a range of 0.1 to 50 µm.

<The Step of Baking the Coating Film>

This is a step of forming a metal film by baking the coating film obtained in the above step.

The baking method can be appropriately selected from conventionally known baking methods. Concrete examples thereof include method such as heating with a baking furnace (oven), infrared heating, baking under a reducing gas atmosphere, baking by laser annealing, and microwave heating.

Even when baked at a low temperature or for a short time, the metal particle dispersion for electroconductive substrates according to the present invention is able to form a metal film with less organic components remaining therein. Therefore, it can be baked at lower temperature than conventional methods.

In the present invention, from the point of view that a metal film with less organic components remaining therein and with excellent electroconductivity can be obtained, the step of baking the coating film is preferably any one of a step of baking the coating film by irradiation with pulsed light (hereinafter may be referred to as pulsed light baking) and a step of baking the coating film by surface wave plasma generated by applying microwave energy (hereinafter may be referred to as plasma baking). By using these methods, heat damage to the base material can be decreased, and metal oxidation can be inhibited when baked. Also, this step has an advantage of increased productivity, because the coating film is baked for a short time.

In the present invention, because the dispersant has reducing properties, an excellent metal film can be formed even in the case of using a metal oxide and carrying out pulsed light baking in the atmosphere and under atmospheric pressure.

(Pulsed Light Baking)

Pulsed light baking is a method of baking the coating film for a quite short time by irradiation with pulsed light. In the present invention, pulsed light means a light with a relatively short emission time, and the light emission time is called pulse width. The light source of the pulsed light is not particularly limited, and examples thereof include a flash lamp filled with rare gas such as xenon and a laser. In particular, it is preferable to irradiate the coating film with a light with a continuous wavelength spectrum extending from the ultraviolet to the infrared. More specifically, it is preferable to use a xenon flash lamp. In the case of using such a light source, it is possible to obtain similar effect to those obtained by carrying out heating and UV irradiation at the same time, and it is also possible to bake the coating film for a quite short time. Also in the case of using such a light source, by controlling the pulse width and irradiation energy, it is possible to heat only the coating film of the coating solution containing the metal particle dispersion and the vicinity thereof, so that it is possible to curb the influence of the heat on the base material.

In the present invention, the pulse width of the pulsed light can be appropriately controlled. The pulse width is preferably set between 1 μs and 10,000 μs, more preferably in a range of 10 μs to 5,000 μs. The irradiation energy of the pulsed light is preferably 0.1 J/cm$^2$ to 100 J/cm$^2$, more preferably 0.5 J/cm$^2$ to 50 J/cm$^2$, per pulse irradiation.

In the pulsed light baking, the number of the pulsed light irradiation can be appropriately controlled, depending on the composition, thickness, area and so on of the coating film. The number of the pulsed light irradiation can be one time, or the irradiation can be repeated two or more times. The number of the pulsed light irradiation is preferably 1 to 100 times, more preferably 1 to 50 times. When the pulsed light irradiation is carried out several times, the interval of the pulsed light irradiation can be appropriately controlled. It is preferable to set the interval in a range of 10 μs to 2 seconds, and it is more preferable to set the interval in a range of 100 μs to 1 second.

By setting the pulsed light irradiation as above, the influence on the base material can be curbed, and the oxidation of the metal particles can be inhibited. Moreover, the dispersant contained in the metal particle dispersion can be easily detached or decomposed, and an electroconductive substrate with excellent electroconductivity can be obtained.

Such pulsed light baking can heat only the coating film of the coating solution containing the metal particle dispersion and the vicinity thereof, so that the coating film can be baked at a low temperature and for a short time, and a dense and smooth metal particle sintered film can be formed. In the pulsed light baking, the heating temperature and baking depth can be controlled by appropriately setting the pulse width and irradiation energy of the pulsed light. As a result, a non-uniform film is less likely to be formed, and the particles can be prevented from growing. Therefore, a very dense, smooth film can be obtained. Also, because the coating film can be baked for a quite short time, the oxidation of the metal particles can be inhibited, and a sintered film with excellent electroconductivity can be formed.

The pulsed light baking can be carried out in the atmosphere and under atmospheric pressure. It can be carried out under inert atmosphere, under reducing atmosphere or under reduced pressure. Also, the pulsed light baking can be carried out with heating the coating film.

(Plasma Baking)

From the viewpoint of the electroconductivity of the thus-sintered film, the baking of the coating film with microwave surface wave plasma is preferably carried out under inert gas atmosphere or reducing gas atmosphere.

Especially in the present invention, it is preferable to generate the microwave surface wave plasma under reducing gas atmosphere, and it is more preferable to generate the microwave surface wave plasma under hydrogen gas atmosphere. Thereby, insulating oxides present on the metal particle surface are reduced and removed, and thus an electroconductive pattern with excellent electroconductivity is formed.

As the reducing gas of the reducing atmosphere, there may be mentioned gasses such as hydrogen gas, carbon monoxide gas and ammonia gas, and combinations thereof. From the viewpoint of producing less by-products, hydrogen gas is particularly preferred.

When the reducing gas is used in combination with an inert gas such as nitrogen, helium, argon, neon, krypton or xenon, there is such an effect that plasma can be easily generated.

Before the microwave surface wave plasma treatment, the coating film can be baked in the atmosphere or under an oxygen-containing atmosphere, at a temperature of about 50 to 200° C. and for about one minute to two hours, in order to remove organic matters (e.g., dispersant) contained in the coating film formed by applying the coating solution containing the metal particle dispersion. This treatment can be carried out under reduced pressure. By this baking, the organic matters are oxidized, decomposed and removed to promote the sintering of the metal particles in the microwave surface wave plasma treatment.

The method for generating the microwave surface wave plasma can be appropriately selected from conventionally known methods. For example, there may be used an electrodeless plasma generating means in which microwave energy is supplied from the irradiation window of a baking treatment chamber in a reduced pressure state to generate surface wave plasma along the irradiation window in the baking treatment chamber.

A concrete example of the electrodeless plasma generating means is as follows: a microwave energy having a frequency of 2,450 MHz is supplied from the irradiation window of a baking treatment chamber to generate microwave surface wave plasma having an electron temperature of about 1 eV or less and an electron density of $1 \times 10^{11}$ to $1 \times 10^{13}$ cm$^{-3}$ in the treatment chamber.

A microwave energy is generally an electromagnetic wave having a frequency of 300 MHz to 3,000 GHz. For example, an electromagnetic wave at 2,450 MHz is used. At this time, when a magnetron is used as a microwave oscillator, it has a frequency range of 2,450 MHz/±50 MHz due to precision error, etc.

Such microwave surface wave plasma has properties of a high plasma density and a low electron temperature, so that it is able to bake the coating film at a low temperature and for a short time, and it is able to form a dense and smooth metal particle sintered film. In the case of using the microwave surface wave plasma, the treatment surface is irradiated with in-plane uniform density plasma. As a result, compared to other baking methods, a non-uniform film is less likely to be formed (e.g., in-plane partial baking of the particles is less likely to be promoted), and the particles can be prevented from growing, so that, a very dense, smooth film can be obtained. Also, it is not needed to provide an electrode in the in-plane treatment chamber, so that contamination of impurities derived from the electrode can be prevented, and also the treated material can be prevented from damage caused by an abnormal electrical discharge.

In addition, the microwave surface wave plasma has a low electron temperature, so that it has a low ability of etching the base material. Therefore, it is presumed that damage to the base material can be minimized.

The thickness of the thus-obtained metal film on the electroconductive substrate can be appropriately controlled depending on the intended use. The thickness is generally about 10 nm to 50 μm, preferably 50 nm to 30 μm, more preferably 100 nm to 20 μm.

The volume resistivity of the metal layer is preferably $1.0 \times 10^{-4}$ Ω·cm or less.

The production method of the present invention can be a method for producing an electroconductive substrate in a pattern, in which a coating film is formed by applying the coating solution containing the metal particle dispersion in a pattern onto the base material, and the coating film is baked to form a metal film in a pattern.

The electroconductive substrate obtained by the electroconductive substrate production method of the present invention is an electroconductive substrate which has succeeded in inhibiting the remaining of organic components therein after sintering, and which has excellent electroconductivity. Electronic members using such an electroconductive substrate can be effectively used in electromagnetic wave shielding films with low surface resistance, electroconductive films, flexible printed wiring boards, etc.

EXAMPLES

Hereinafter, the present invention will be described in detail, by way of examples. The scope of the present invention is not limited by the examples.

Synthesis Example 1. Production of Copper Particles

First, 64 g of copper(II) oxide and 5.1 g of gelatin, which functions as an organic protective agent, were added to 650 mL of pure water and mixed to prepare a mixed solution. The pH of the mixed solution was set to 10 by using 15% ammonia water. Then, the temperature of the mixed solution was increased from room temperature to 90° C. for 20 minutes. After increasing the temperature, with stirring the mixed solution, a solution obtained by mixing 6.4 g of 1% mercaptoacetic acid solution and 75 g of 80% hydrazine monohydrate, which function as a complexing agent, with 150 mL of pure water, was added to the mixed solution and reacted with the copper(II) oxide for one hour, thereby obtaining copper particles. The copper particles were observed with a scanning transmission electron microscope (STEM) and found to have an average primary particle diameter of 50 nm.

Synthesis Example 2. Synthesis of Macromonomer MM-1

First, 100.0 parts by mass of PGMEA was put in a reactor equipped with a cooling tube, an addition funnel, a nitrogen inlet, a mechanical stirrer and a digital thermometer, and heated to 90° C. with stirring under a nitrogen flow. A mixed solution of 50.0 parts by mass of methyl methacrylate, 15.0 parts by mass of butyl methacrylate, 15.0 parts by mass of benzyl methacrylate, 20.0 parts by mass of ethoxyethyl methacrylate, 4.0 parts by mass of 2-mercaptoethanol and 1.3 parts by mass of PERBUTYL O (manufactured by NOF Corporation) was added thereto in a dropwise manner for 1.5 hours, and the mixture was reacted for 3 hours. Next, nitrogen flow was stopped and the reaction solution was cooled to 80° C. To the cooled reaction solution, 8.74 parts by mass of Karenz MOI (manufactured by Showa Denko K. K.), 0.125 part by mass of dibutyltin dilaurate, 0.125 part by mass of p-methoxyphenol and 10 parts by mass of PGMEA were added and stirred for 3 hours, thereby obtaining a 49.8% by mass solution of the macromonomer MM-1. The thus-obtained macromonomer MM-1 was confirmed by GPC (gel permeation chromatography) under the condition of addition of N-methylpyrrolidone and 0.01 mol/L lithium bromide/polystyrene standard. As a result, the macromonomer MM-1 was found to have a mass average molecular weight (Mw) of 3,657, a number average molecular weight (Mn) of 1,772 and a molecular weight distribution (Mw/Mn) of 2.06.

Synthesis Example 3. Synthesis of Graft Copolymer GP-1

First, 85.0 parts by mass of PGMEA was put in a reactor equipped with a cooling tube, an addition funnel, a nitrogen inlet, a mechanical stirrer and a digital thermometer, and heated to 85° C. with stirring under a nitrogen flow. A mixed solution of 8.33 parts by mass of 1-vinyl-2-pyrrolidone, 66.93 parts by mass of the macromonomer MM-1 solution of Synthesis Example 2 (active solid content 33.33 parts by mass), 8.33 parts by mass of dimethylaminoethyl methacrylate, 1.86 parts by mass of n-dodecyl mercaptan, 20.0 parts by mass of PGMEA and 0.5 part by mass of azobisisobutyronitrile (AIBN) was added thereto in a dropwise manner for 1.5 hours. The mixture was heated and stirred for 3 hours. Then, a mixed solution of 0.10 part by mass of AIBN and 10.0 parts by mass of PGMEA was added thereto in a dropwise manner for 10 minutes, and the mixture was further heated at the same temperature for one hour, thereby obtaining a 25.3% by mass solution of the graft copolymer GP-1. As a result of GPC measurement, the thus-obtained graft copolymer GP-1 was found to have a mass average molecular weight (Mw) of 8,677, a number average molecular weight (Mn) of 3,584 and a molecular weight distribution (Mw/Mn) of 2.42. The amine value was 59.5 mgKOH/g.

Synthesis Example 4. Synthesis of Graft Copolymer GP-2

First, 85.0 parts by mass of PGMEA was put in a reactor equipped with a cooling tube, an addition funnel, a nitrogen inlet, a mechanical stirrer and a digital thermometer, and heated to 85° C. with stirring under a nitrogen flow. A mixed solution of 16.67 parts by mass of 1-vinyl-2-pyrrolidone, 66.93 parts by mass of the macromonomer MM-1 solution of Synthesis Example 2 (active solid content 33.33 parts by mass), 1.86 parts by mass of n-dodecyl mercaptan, 20.0 parts by mass of PGMEA and 0.5 part by mass of AIBN was added thereto in a dropwise manner for 1.5 hours. The mixture was heated and stirred for 3 hours. Then, a mixed solution of 0.10 part by mass of AIBN and 10.0 parts by mass of PGMEA was added thereto in a dropwise manner for 10 minutes, and the mixture was further heated at the same temperature for one hour, thereby obtaining a 25.3% by mass solution of the graft copolymer GP-2. As a result of GPC measurement, the thus-obtained graft copolymer GP-2 was found to have a mass average molecular weight (Mw) of 8,716, a number average molecular weight (Mn) of 3,727 and a molecular weight distribution (Mw/Mn) of 2.70. The amine value was 0 mgKOH/g.

Production Example 1. Preparation of Dispersant Solution A

In a 100 mL recovery flask, 12.16 parts by mass of the graft copolymer GP-1 obtained in Synthesis Example 3 (active solid content 3.08 parts by mass) was dissolved in 4.44 parts by mass of PGMEA. In addition, 0.30 part by mass of phenylphosphonic acid (product name: PPA, manufactured by: Nissan Chemical Industries, Ltd.) (0.3 molar equivalent with respect to the tertiary amino groups of the graft copolymer) was added thereto. The mixture was stirred at 40° C. for 30 minutes, thereby preparing the dispersant solution A (solid content 20%). At this time, a salt was formed by acid-base reaction of the amino group of the graft copolymer with the phenylphosphonic acid.

Production Example 2. Preparation of Dispersant Solution B

In a 100 mL recovery flask, 12.16 parts by mass of the graft copolymer GP-1 obtained in Synthesis Example 3 (active solid content 3.08 parts by mass) was dissolved in 3.72 parts by mass of PGMEA. In addition, 0.12 part by mass of allyl bromide (manufactured by Kanto Chemical Co., Inc.) (0.3 molar equivalent with respect to the tertiary amino groups of the graft copolymer) was added thereto. The mixture was stirred at 40° C. for 30 minutes, thereby preparing the dispersant solution B (solid content 20%). At this time, a salt was formed by acid-base reaction of the amino group of the graft copolymer with the allyl bromide.

Production Example 3. Preparation of Dispersant Solution C

In a 100 mL recovery flask, 12.16 parts by mass of the graft copolymer GP-1 obtained in Synthesis Example 3 (active solid content 3.08 parts by mass) was dissolved in 4.00 parts by mass of PGMEA. In addition, 0.19 part by mass of p-toluenesulfonic acid monohydrate (manufactured by Junsei Chemical Co., Ltd.) (0.3 molar equivalent with respect to the tertiary amino groups of the graft copolymer) was added thereto. The mixture was stirred at 40° C. for 30 minutes, thereby preparing the dispersant solution C (solid content 20%). At this time, a salt was formed by acid-base reaction of the amino group of the graft copolymer with the p-toluenesulfonic acid monohydrate.

Example 1. Preparation of Metal Particle Dispersion

First, 6.0 parts by mass of core-shell particles (core: copper, shell: copper oxide, manufactured by: qsI-Nano) as metal particles, 2.25 parts by mass of the dispersant solution A (solid content equivalent 0.45 part by mass) and 6.75 parts by mass of PGMEA were mixed. Using a paint shaker (manufactured by Asada Iron Works Co., Ltd.), the mixture was subjected to pre-dispersion for 1 hour with 2 mm zirconia beads. Then, the mixture was subjected to main dispersion for 4 hours with 0.1 mm zirconia beads, thereby obtaining the metal particle dispersion 1.

Example 2. Preparation of Metal Particle Dispersion

The metal particle dispersion 2 was obtained in the same manner as Example 1, except that the metal particles were changed to 6.0 parts by mass of copper oxide particles (manufactured by CIK NanoTek Corporation).

Example 3. Preparation of Metal Particle Dispersion

The metal particle dispersion 3 was obtained in the same manner as Example 1, except that the metal particles were changed to 6.0 parts by mass of the copper particles of Synthesis Example 1.

Example 4. Preparation of Metal Particle Dispersion

The metal particle dispersion 4 was obtained in the same manner as Example 3, except that 2.25 parts by mass of the dispersant solution A was changed to 2.25 parts by mass of the dispersant solution B obtained in Production Example 2.

Example 5. Preparation of Metal Particle Dispersion

The metal particle dispersion 5 was obtained in the same manner as Example 3, except that 2.25 parts by mass of the dispersant solution A was changed to 2.25 parts by mass of the dispersant solution C obtained in Production Example 3.

Example 6. Preparation of Metal Particle Dispersion

First, 6.0 parts by mass of the copper particles of Synthesis Example 1, 1.78 parts by mass of the graft copolymer GP-1 of Synthesis Example 3 (solid content equivalent 0.45 part by mass) and 7.22 parts by mass of PGMEA were mixed. Using a paint shaker (manufactured by Asada Iron Works Co., Ltd.), the mixture was subjected to pre-dispersion for 1 hour with 2 mm zirconia beads. Then, the mixture was further subjected to main dispersion for 4 hours with 0.1 mm zirconia beads, thereby obtaining the metal particle dispersion 6.

Example 7. Preparation of Metal Particle Dispersion

First, 6.0 parts by mass of the copper particles of Synthesis Example 1, 1.78 parts by mass of the graft copolymer GP-2 of Synthesis Example 4 (solid content equivalent 0.45 part by mass) and 7.22 parts by mass of PGMEA were mixed. Using a paint shaker (manufactured by Asada Iron Works Co., Ltd.), the mixture was subjected to pre-dispersion for 1 hour with 2 mm zirconia beads. Then, the mixture was further subjected to main dispersion for 4 hours with 0.1 mm zirconia beads, thereby obtaining the metal particle dispersion 7.

Comparative Example 1

A comparative metal particle dispersion 1 was obtained in the same manner as Example 1, except that 0.45 part by mass (solid content equivalent) of polyvinylpyrrolidone (PVP, mass average molecular weight 10,000, manufactured by Nippon Shokubai Co., Ltd., product name K-15) was used in place of the dispersant solution A, and 8.55 parts by mass of isopropyl alcohol (IPA) was added in place of the PGMEA.

Comparative Example 2

A comparative metal particle dispersion 2 was obtained in the same manner as Example 1, except that 0.45 part by mass (solid content equivalent) of polyvinylpyrrolidone (mass average molecular weight 10,000, K-15 manufactured by Nippon Shokubai Co., Ltd.) was used in place of the dispersant solution A, and PGMEA was added so that the total amount was 15.0 parts by mass.

Comparative Example 3

A comparative metal particle dispersion 3 was obtained in the same manner as Example 2, except that 0.45 part by mass (solid content equivalent) of polyvinylpyrrolidone (mass average molecular weight 10,000, K-15 manufactured by Nippon Shokubai Co., Ltd.) was used in place of the dispersant solution A, and 8.55 parts by mass of isopropyl alcohol (IPA) was added in place of the PGMEA.

Comparative Example 4

A comparative metal particle dispersion 4 was obtained in the same manner as Example 2, except that 0.45 part by mass (solid content equivalent) of polyvinylpyrrolidone (mass average molecular weight 10,000, K-15 manufactured by Nippon Shokubai Co., Ltd.) was used in place of the dispersant solution A, and PGMEA was added so that the total amount was 15.0 parts by mass.

Comparative Example 5

A comparative metal particle dispersion 5 was obtained in the same manner as Example 2, except that 0.45 part by mass (solid content equivalent) of SOLSPERSE 71000 (manufactured by The Lubrizol Corporation) was used in place of the dispersant solution A, and PGMEA was added so that the total amount was 15.0 parts by mass.

(Evaluation)

(1) Evaluation of the Dispersibility of Metal Particle Dispersion

To evaluate the dispersibility of the metal particles, the average particle diameter of the metal particles contained in each of the metal particle dispersions obtained in Examples and Comparative Examples, was measured. To measure the average particle diameter, "Microtrac Particle Size Distribution Analyzer UPA-EX150" (manufactured by Nikkiso Co., Ltd.) was used.

Each of the metal particle dispersions obtained in Examples and Comparative Examples was left to stand for one day. Then, each metal particle dispersion was visually observed to check the presence of precipitates.

[Criterion for Evaluation of the Dispersibility]

◎: The average particle diameter is 150 nm or less and no precipitates are found.

○: The average particle diameter is 150 nm or less or no precipitates are found.

x: The average particle diameter is more than 150 nm and precipitates are found.

The evaluation results of the dispersibility are shown in Table 1.

(2) Production of Electroconductive Substrate

Each of the metal particle dispersions obtained in Examples and Comparative Examples was applied onto a polyimide film (product name: Kapton 300H, manufactured by: Toray-DuPont Co., Ltd., thickness 75 μm) with a wire bar and dried at 100° C. for 15 minutes, thereby obtaining a coating film having a thickness of 1 μm.

Using a pulsed xenon lamp (SINTERON 2000 manufactured by Xenon Corporation), each coating film was irradiated once with pulsed light at a pulse width of 500 μs and an applied voltage of 3.8 kV, thereby producing an electroconductive substrate.

<Evaluation of Coating Properties>

Coating films of the metal particle dispersions obtained in Examples and Comparative Examples were formed. Before baking the coating films, they were evaluated for their coating properties. The film quality of the coating films of the metal particle dispersions was visually observed.

[Criterion for Evaluation of the Coating Properties]

○: No cissing is found and the coating film is uniform.

x: Cissing is found and the coating film is not uniform.

<Evaluation of Electroconductivity>

The electroconductive substrates obtained by the pulsed light baking were evaluated for their electroconductivity.

Using a surface resistance meter ("Loresta GP" manufactured by Dia Instruments Co., Ltd., PSP type probe), the metal film on each of the electroconductive substrates of Examples and Comparative Examples was brought into contact with the four-point probe to measure the sheet surface resistance by the four-probe method. The results are shown in Table 1. As the sheet surface resistance gets smaller, the electroconductivity gets better. The upper measurement limit of the sheet surface resistance by this measurement method was $10^8 \Omega/\square$.

TABLE 1

| | Metal particles | Dispersant | Salt formation | Solvent | Average particle diameter (nm) | Dispersibility | Coating properties | Electroconductivity ($\Omega/\square$) |
|---|---|---|---|---|---|---|---|---|
| Example 1 | Core-shell | GP-1 | PPA | PGMEA | 104.3 | ◎ | ○ | 0.66 |
| Example 2 | CuO | GP-1 | PPA | PGMEA | 129.8 | ◎ | ○ | 0.79 |
| Example 3 | Cu | GP-1 | PPA | PGMEA | 65.6 | ◎ | ○ | 0.60 |
| Example 4 | Cu | GP-1 | Allyl bromide | PGMEA | 62.3 | ◎ | ○ | 0.58 |
| Example 5 | Cu | GP-1 | p-Toluenesulfonic acid monohydrate | PGMEA | 68.2 | ◎ | ○ | 0.59 |

TABLE 1-continued

| | Metal particles | Dispersant | Salt formation | Solvent | Average particle diameter (nm) | Dispersibility | Coating properties | Electroconductivity (Ω/□) |
|---|---|---|---|---|---|---|---|---|
| Example 6 | Cu | GP-1 | | PGMEA | 80.2 | ○ | ○ | 0.62 |
| Example 7 | Cu | GP-2 | | PGMEA | 145.7 | ○ | ○ | 0.68 |
| Comparative Example 1 | Core-shell | PVP | | IPA | 350 | X | X | 0.67 |
| Comparative Example 2 | Core-shell | PVP | | PGMEA | Non-dispersible | X | X | Unmeasurable |
| Comparative xample 3 | CuO | PVP | | IPA | 300 | X | X | 0.88 |
| Comparative Example 4 | CuO | PVP | | PGMEA | Non-dispersible | X | X | Unmeasurable |
| Comparative Example 5 | CuO | SOLSPERSE 71000 | | PGMEA | 180 | X | X | Unmeasurable |

CONCLUSION

In Examples 1 to 7 of the present invention, the metal particle dispersions for electroconductive substrates which have high dispersibility and dispersion stability were obtained. It is clear that the metal particle dispersions have excellent coating properties and are able to form a film that shows high electroconductivity after baking.

It is clear from Examples 1 and 2 that even in the case of using metal particles such as core-shell particles in which the outermost surface is made of an oxide or metal oxide particles, an electroconductive substrate with excellent electroconductivity is obtained.

In Comparative Examples 1 to 4 in which polyvinylpyrrolidone was used as the dispersant, the metal particles could not be dispersed with PGMEA, so that they were dispersed with IPA. However, Comparative Examples 1 to 4 showed poor dispersibility and inferior coating properties. Therefore, it is clear that electroconductive areas and disconnected areas are formed.

In Comparative Example 5 in which a prior art dispersant SOLSPERSE 71000 was used as the dispersant, it is clear that excellent electroconductivity is not obtained when metal oxide particles are used.

REFERENCE SIGNS LIST

1. Base material
2. Metal film
100. Substrate

The invention claimed is:
1. A metal particle dispersion for electroconductive substrates, comprising metal particles, a dispersant and a solvent,
wherein the dispersant is a graft copolymer comprising at least a constitutional unit represented by the following chemical formula (I) and a constitutional unit represented by the following chemical formula (II):

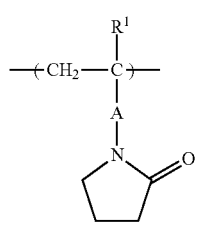

Chemical Formula (I)

Chemical Formula (II)

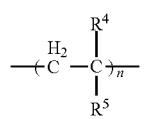

wherein $R^1$ and $R^{1'}$ are each independently a hydrogen atom or a methyl group; "A" is a direct bond or a divalent linking group, and the divalent linking group as "A" is at least one selected from the group consisting of an alkylene group comprising 1 to 10 carbon atoms, an arylene group, a —CONH— group, a —COO— group, an ether group comprising 1 to 10 carbon atoms comprising the formula —R'—OR"— wherein R' and R" are each independently an alkylene group and combinations thereof; "L" is a direct bond or a divalent linking group, and the divalent linking group as "L" is at least one selected from the group consisting of an alkylene group, an alkylene group comprising a hydroxyl group, an arylene group, a —CONH— group, a —COO— group, a —NHCOO— group, an ether group (—O— group), a thioether group (—S— group) and combinations thereof; and "Polymer" is a polymer chain comprising at least one constitutional unit represented by the following chemical formula (IV) or (V):

Chemical Formula (IV)

Chemical Formula (V)

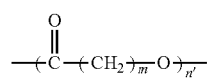

wherein $R^4$ is a hydrogen atom or a methyl group; $R^5$ is a hydrocarbon group optionally comprising a substituent group, a cyano group or a monovalent group represented by —[CH($R^6$)—CH($R^7$)—O]$_x$—$R^8$, —[(CH$_2$)$_y$—O]$_z$—$R^8$, —[CO—(CH$_2$)$_y$—O]$_z$—$R^8$, —CO—O—$R^9$ or —O—CO—$R^{10}$; $R^6$ and $R^7$ are each independently a hydrogen atom or a methyl group;

$R^8$ is a hydrogen atom, a hydrocarbon group optionally comprising a substituent group, or a monovalent group represented by —CHO, —CH$_2$CHO or —CH$_2$COOR$^{11}$; $R^9$ is a hydrocarbon group optionally comprising a substituent group, a cyano group or a monovalent group represented by —[CH(R$^6$)—CH(R$^7$)—O]$_x$—R$^8$, —[(CH$_2$)$_y$—O]$_z$—R$^8$ or —[CO—(CH$_2$)$_y$—O]$_z$—R$^8$; $R^{10}$ is an alkyl group comprising 1 to 18 carbon atoms, and the alkyl group optionally comprises a substituent group; $R^{11}$ is a hydrogen atom or an alkyl group comprising 1 to 5 carbon atoms;

the substituent group in $R^5$, $R^8$, $R^9$ and $R^{10}$ is at least one selected from the group consisting of a nitro group, a halogen atom, an alkoxy group, a hydroxyl group, a carboxyl group, an amino group, an epoxy group and an isocyanate group, and when $R^5$, $R^8$ and $R^9$ are each a group comprising an aromatic ring, the aromatic ring optionally comprises a substituent group of an alkyl or alkenyl group;

m is an integer of 1 to 5; n and n' are each an integer of 5 to 200; x is an integer of 1 to 18; y is an integer of 1 to 5; and z is an integer of 1 to 18.

2. The metal particle dispersion for electroconductive substrates according to claim 1, wherein the graft copolymer as the dispersant further comprises a constitutional unit represented by the following chemical formula (III):

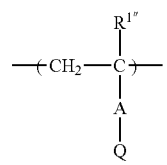

Chemical Formula (III)

wherein R$^{1'''}$ is a hydrogen atom or a methyl group; "A'" is a direct bond or a divalent linking group, and the divalent linking group as "A'" is at least one selected from the group consisting of an alkylene group comprising 1 to 10 carbon atoms, an arylene group, a —CONH— group, a —COO— group, an ether group comprising 1 to 10 carbon atoms comprising the formula —R'''—OR''''— wherein R''' and R'''' are each independently an alkylene group and combinations thereof; and "Q" is a group represented by the following chemical formula (III-a) or a nitrogen-containing heterocyclic group which is able to form a salt with an acid or a halogenated hydrocarbon, and the nitrogen-containing heterocyclic group optionally comprises a substituent group which is at least one selected from the group consisting of a halogen atom, an alkyl group comprising 1 to 12 carbon atoms, an aralkyl group and an aryl group:

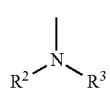

Chemical Formula (III-a)

wherein R$^2$ and R$^3$ are each independently a hydrogen atom or a hydrocarbon group which optionally contains a heteroatom; the hydrocarbon group optionally comprises a substituent group, and the substituent group in R$^2$ and R$^3$ is a halogen atom; and R$^2$ and R$^3$ can be the same as or different from each other.

3. The metal particle dispersion for electroconductive substrates according to claim 2, wherein, in the graft copolymer as the dispersant, a salt is formed between at least a part of a nitrogen site contained in the constitutional unit represented by the chemical formula (III) and at least one selected from the group consisting of an acidic phosphorus compound, a sulfonic acid compound and a halogenated hydrocarbon.

4. The metal particle dispersion for electroconductive substrates according to claim 3, wherein, in the dispersant, the acidic phosphorus compound is a compound represented by the following chemical formula (VI); the sulfonic acid compound is a compound represented by the following chemical formula (VII); and the halogenated hydrocarbon is one or more selected from the group consisting of a halogenated benzyl, a halogenated allyl and a halogenated methyl:

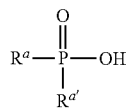

Chemical Formula (VI)

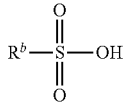

Chemical Formula (VII)

wherein R$^a$ and R$^{a'}$ are each independently a hydrogen atom, a hydroxyl group, a hydrocarbon group optionally comprising a substituent group, or a monovalent group represented by —[CH(R$^c$)—CH(R$^d$)—O]$_s$—R$^e$, —[(CH$_2$)$_t$—O]$_u$—R$^e$ or —O—R$^{a''}$; R$^{a''}$ is a hydrocarbon group optionally comprising a substituent group, or a monovalent group represented by —[CH(R$^c$)—CH(R$^d$)—O]$_s$—R$^e$, —[(CH$_2$)$_t$—O]$_u$—R$^e$, —C(R$^f$)(R$^g$)—C(R$^h$)(R$^i$)—OH or —CH$_2$—C(R$^j$)(R$^k$)—CH$_2$—OH;

R$^b$ is a hydrocarbon group optionally comprising a substituent group, or a monovalent group represented by —[CH(R$^c$)—CH(R$^d$)—O]$_s$—R$^e$, —[(CH$_2$)$_t$—O]$_u$—R$^e$ or —O—R$^{b'}$; R$^{b'}$ is a hydrocarbon group optionally comprising a substituent group, or a monovalent group represented by —[CH(R$^c$)—CH(R$^d$)—O]$_s$—R$^e$ or —[(CH$_2$)$_t$—O]$_u$—R$^e$;

R$^c$ and R$^d$ are each independently a hydrogen atom or a methyl group; R$^e$ is a hydrogen atom, a hydrocarbon group which optionally comprising a substituent group, or a monovalent group represented by —CHO, —CH$_2$CHO, —CO—CH=CH$_2$, —CO—C(CH$_3$)=CH$_2$ or —CH$_2$COOR$^{e'}$; R$^{e'}$ is a hydrogen atom or an alkyl group comprising 1 to 5 carbon atoms; R$^f$, R$^g$, R$^h$, R$^i$, R$^j$ and R$^k$ are each independently a hydrogen atom, a hydrocarbon group optionally comprising a substituent group, or a group in which hydrocarbon groups optionally comprising a substituent group are bound by at least one of an ether bond and an ester bond, and R$^f$ and R$^h$ can be bound to each other to form a cyclic structure; when the cyclic structure is formed, the cyclic structure optionally comprises a substituent group R$^l$, and R$^l$ is a hydrogen atom, a hydrocarbon group optionally comprising a substituent group, or a group in which hydrocarbon groups optionally comprising a substituent group are bound by at least one of an ether bond and an ester bond;

the substituent group in $R^a$, $R^{a'}$, $R^{a''}$, $R^b$, $R^{b'}$, $R^e$, $R^f$, $R^g$, $R^h$, $R^i$, $R^j$, $R^k$ and $R^l$ is at least one selected from the group consisting of a nitro group and a halogen atom, and when $R^a$, $R^{a'}$, $R^{a''}$, $R^b$, $R^{b'}$, $R^e$, $R^f$, $R^g$, $R^h$, $R^i$, $R^j$, $R^k$ and $R^l$ are each a group comprising an aromatic ring, the aromatic ring optionally comprises a substituent group of an alkyl or alkenyl group;

s is an integer of 1 to 18; t is an integer of 1 to 5; and u is an integer of 1 to 18.

5. The metal particle dispersion for electroconductive substrates according to claim 1, wherein the metal particles are metal particles containing one or more selected from the group consisting of gold, silver, copper and oxides thereof.

6. A method for producing a metal particle dispersion for electroconductive substrates, comprising the steps of:

preparing a dispersant by preparing a graft copolymer in which at least a monomer represented by the following chemical formula (I') and a polymerizable oligomer comprising a polymer chain comprising at least one constitutional unit represented by the following chemical formula (IV) or (V) and a group comprising an ethylenically unsaturated double bond at a terminal of the chain, are contained as copolymerizable components and copolymerized, and dispersing the thus-obtained dispersant and metal particles in a solvent:

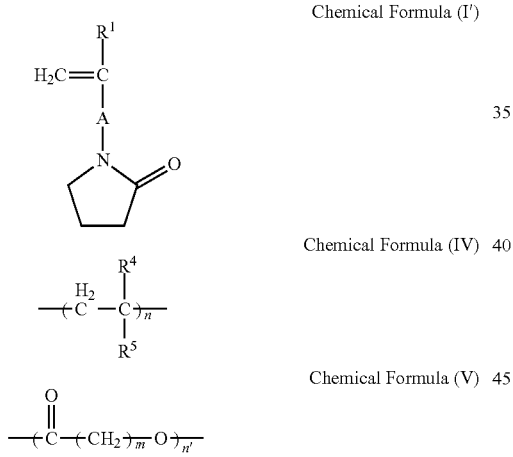

Chemical Formula (I')

Chemical Formula (IV)

Chemical Formula (V)

wherein $R^1$ is a hydrogen atom or a methyl group; "A" is a direct bond or a divalent linking group, and the divalent linking group as "A" is at least one selected from the group consisting of an alkylene group comprising 1 to 10 carbon atoms, an arylene group, a —CONH— group, a —COO— group, an ether group comprising 1 to 10 carbon atoms comprising the formula —R'—OR"— wherein R' and R" are each independently an alkylene group and combinations thereof;

wherein $R^4$ is a hydrogen atom or a methyl group; $R^5$ is a hydrocarbon group optionally comprising a substituent group, a cyano group or a monovalent group represented by —[CH($R^6$)—CH($R^7$)—O]$_x$—$R^8$, —[(CH$_2$)$_y$—O]$_z$—$R^8$, —[CO—(CH$_2$)$_y$—O]$_z$—$R^8$, —CO—O—$R^9$ or —O—CO—$R^{10}$; $R^6$ and $R^7$ are each independently a hydrogen atom or a methyl group; $R^8$ is a hydrogen atom, a hydrocarbon group optionally comprising a substituent group, or a monovalent group represented by —CHO, —CH$_2$CHO or —CH$_2$COOR$^{11}$; $R^9$ is a hydrocarbon group optionally comprising a substituent group, a cyano group or a monovalent group represented by —[CH($R^6$)—CH($R^7$)—O]$_x$—$R^8$, —[(CH$_2$)$_y$—O]$_z$—$R^8$ or —[CO—(CH$_2$)$_y$—O]$_z$—$R^8$; $R^{10}$ is an alkyl group comprising 1 to 18 carbon atoms, and the alkyl group optionally comprises a substituent group; $R^{11}$ is a hydrogen atom or an alkyl group comprising 1 to 5 carbon atoms;

the substituent group in $R^5$, $R^8$, $R^9$ and $R^{10}$ is at least one selected from the group consisting of a nitro group, a halogen atom, an alkoxy group, a hydroxyl group, a carboxyl group, an amino group, an epoxy group and an isocyanate group, and when $R^5$, $R^8$ and $R^9$ are each a group comprising an aromatic ring, the aromatic ring optionally comprises a substituent group of an alkyl or alkenyl group;

m is an integer of 1 to 5; n and n' are each an integer of 5 to 200; x is an integer of 1 to 18; y is an integer of 1 to 5; and z is an integer of 1 to 18.

7. The method for producing a metal particle dispersion for electroconductive substrates according to claim 6, wherein, in the dispersant preparing step, the graft copolymer is prepared by further containing a monomer represented by the following chemical formula (III') therein as a copolymerizable component:

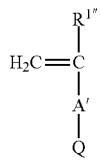

Chemical Formula (III')

wherein $R^{1''}$ is a hydrogen atom or a methyl group; "A'" is a direct bond or a divalent linking group, and the divalent linking group as "A'" is at least one selected from the group consisting of an alkylene group comprising 1 to 10 carbon atoms, an arylene group, a —CONH— group, a —COO— group, an ether group comprising 1 to 10 carbon atoms comprising the formula —R'''—OR''''— wherein R''' and R'''' are each independently an alkylene group and combinations thereof; and "Q" is a group represented by the following chemical formula (III-a) or a nitrogen-containing heterocyclic group which is able to form a salt with an acid or a halogenated hydrocarbon, and the nitrogen-containing heterocyclic group optionally comprises a substituent group which is at least one selected from the group consisting of a halogen atom, an alkyl group comprising 1 to 12 carbon atoms, an aralkyl group and an aryl group:

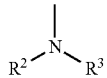

Chemical Formula (III-a)

wherein $R^2$ and $R^3$ are each independently a hydrogen atom or a hydrocarbon group which optionally contains a heteroatom; the hydrocarbon group optionally comprises a substituent group, and the substituent group in R² and R³ is a halogen atom; and R² and R³ can be the same as or different from each other.

8. The method for producing a metal particle dispersion for electroconductive substrates according to claim 7, wherein, in the dispersant preparing step, the graft copolymer is prepared and mixed with at least one selected from the group consisting of an acidic phosphorus compound, a sulfonic acid compound and a halogenated hydrocarbon, thereby forming a salt between at least a part of a nitrogen site derived from the nitrogen-containing monomer represented by the chemical formula (III') of the graft copolymer and at least one selected from the group consisting of the acidic phosphorus compound, the sulfonic acid compound and the halogenated hydrocarbon.

9. The method for producing a metal particle dispersion for electroconductive substrates according to claim 8, wherein, in the dispersant preparing step, the acidic phosphorus compound is a compound represented by the following chemical formula (VI); the sulfonic acid compound is a compound represented by the following chemical formula (VII); and the halogenated hydrocarbon is one or more selected from the group consisting of a halogenated benzyl, a halogenated allyl and a halogenated methyl:

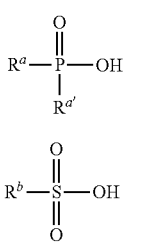

Chemical Formula (VI)

Chemical Formula (VII)

wherein $R^a$ and $R^{a'}$ are each independently a hydrogen atom, a hydroxyl group, a hydrocarbon group optionally comprising a substituent group, or a monovalent group represented by —[CH($R^c$)—CH($R^d$)—O]$_s$—$R^e$, —[(CH$_2$)$_t$—O]$_u$—$R^e$ or —O—$R^{a''}$; $R^{a''}$ is a hydrocarbon group optionally comprising a substituent group, or a monovalent group represented by —[CH($R^c$)—CH($R^d$)—O]$_s$—$R^e$, —[(CH$_2$)$_t$—O]$_u$—$R^e$, —C($R^f$)($R^g$)—C($R^h$)($R^i$)—OH or —CH$_2$—C($R^j$)($R^k$)—CH$_2$—OH;

$R^b$ is a hydrocarbon group optionally comprising a substituent group, or a monovalent group represented by —[CH($R^c$)—CH($R^d$)—O]$_s$—$R^e$, —[(CH$_2$)$_t$—O]$_u$—$R^e$ or —O—$R^{b'}$; $R^{b'}$ is a hydrocarbon group optionally comprising a substituent group, or a monovalent group represented by —[CH($R^c$)—CH($R^d$)—O]$_s$—$R^e$ or —[(CH$_2$)$_t$—O]$_u$—$R^e$;

$R^c$ and $R^d$ are each independently a hydrogen atom or a methyl group; $R^e$ is a hydrogen atom, a hydrocarbon group optionally comprising a substituent group, or a monovalent group represented by —CHO, —CH$_2$CHO, —CO—CH=CH$_2$, —CO—C(CH$_3$)=CH$_2$ or —CH$_2$COO$R^{e'}$; $R^{e'}$ is a hydrogen atom or an alkyl group comprising 1 to 5 carbon atoms; $R^f$, $R^g$, $R^h$, $R^i$, $R^j$ and $R^k$ are each independently a hydrogen atom, a hydrocarbon group optionally comprising a optionally comprising a substituent group, or a group in which hydrocarbon groups optionally comprising a substituent group are bound by at least one of an ether bond and an ester bond, and $R^f$ and $R^h$ can be bound to each other to form a cyclic structure; when the cyclic structure is formed, the cyclic structure optionally comprises a substituent group $R^l$, and $R^l$ is a hydrogen atom, a hydrocarbon group optionally comprising a substituent group, or a group in which hydrocarbon groups optionally comprising a substituent group are bound by at least one of an ether bond and an ester bond;

the substituent group in $R^a$, $R^{a'}$, $R^{a''}$, $R^b$, $R^{b'}$, $R^e$, $R^f$, $R^g$, $R^h$, $R^i$, $R^j$, $R^k$ and $R^l$ is at least one selected from the group consisting of a nitro group and a halogen atom, and when $R^a$, $R^{a'}$, $R^{a''}$, $R^b$, $R^{b'}$, $R^e$, $R^f$, $R^g$, $R^h$, $R^i$, $R^j$, $R^k$ and $R^l$ are each a group comprising an aromatic ring, the aromatic ring optionally comprises a substituent group of an alkyl or alkenyl group;

s is an integer of 1 to 18; t is an integer of 1 to 5; and u is an integer of 1 to 18.

10. The method for producing a metal particle dispersion for electroconductive substrates according to claim 6, wherein the metal particles are metal particles containing one or more selected from the group consisting of gold, silver, copper and oxides thereof.

11. A method for producing an electroconductive substrate, comprising the steps of:
forming a coating film by applying, onto a base material, a coating solution which contains a metal particle dispersion for electroconductive substrates, comprising metal particles, a dispersant and a solvent, wherein the dispersant is a graft copolymer comprising at least a constitutional unit represented by the following chemical formula (I) and a constitutional unit represented by the following chemical formula (II), and
baking the coating film:

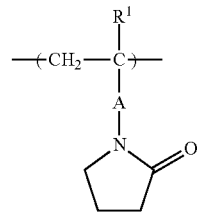

Chemical Formula (I)

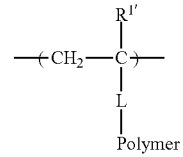

Chemical Formula (II)

wherein $R^1$ and $R^{1'}$ are each independently a hydrogen atom or a methyl group; "A" is a direct bond or a divalent linking group, and the divalent linking group as "A" is at least one selected from the group consisting of an alkylene group comprising 1 to 10 carbon atoms, an arylene group, a —CONH— group, a —COO— group, an ether group comprising 1 to 10 carbon atoms comprising the formula —R'—OR"— wherein R' and R" are each independently an alkylene group and combinations thereof; "L" is a direct bond or a divalent linking group, and the divalent linking group as "L" is at least one selected from the group consisting of an alkylene group, an alkylene group comprising a hydroxyl group, an arylene group, a —CONH— group, a —COO— group, a —NHCOO— group, an ether group (—O— group), a thioether group (—S— group) and combinations thereof; and "Polymer" is a polymer chain comprising at least one constitutional unit represented by the following chemical formula (IV) or (V):

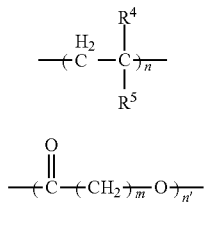

Chemical Formula (IV)

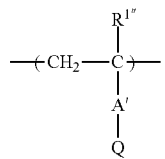

Chemical Formula (V)

wherein $R^4$ is a hydrogen atom or a methyl group; $R^5$ is a hydrocarbon group optionally comprising a substituent group, a cyano group or a monovalent group represented by —[CH($R^6$)—CH($R^7$)O]$_x$—$R^8$, —[(CH$_2$)$_y$—O]$_z$—$R^8$, —[CO—(CH$_2$)$_y$—O]$_z$—$R^8$, —CO—O—$R^9$ or —O—CO—$R^{10}$; $R^6$ and $R^7$ are each independently a hydrogen atom or a methyl group;

$R^8$ is a hydrogen atom, a hydrocarbon group optionally comprising a substituent group, or a monovalent group represented by —CHO, —CH$_2$CHO or —CH$_2$COOR$^{11}$; $R^9$ is a hydrocarbon group optionally comprising a substituent group, a cyano group or a monovalent group represented by —[CH($R^6$)—CH($R^7$)—O]$_x$—$R^8$, —[(CH$_2$)$_y$—O]$_z$—$R^8$ or —[CO—(CH$_2$)$_y$—O]$_z$—$R^8$; $R^{10}$ is an alkyl group comprising 1 to 18 carbon atoms, and the alkyl group optionally comprises a substituent group; $R^{11}$ is a hydrogen atom or an alkyl group comprising 1 to 5 carbon atoms;

the substituent group in $R^5$, $R^8$, $R^9$ and $R^{10}$ is at least one selected from the group consisting of a nitro group, a halogen atom, an alkoxy group, a hydroxyl group, a carboxyl group, an amino group, an epoxy group and an isocyanate group, and when $R^5$, $R^8$ and $R^9$ are each a group comprising an aromatic ring, the aromatic ring optionally comprises a substituent group of an alkyl or alkenyl group;

m is an integer of 1 to 5; n and n' are each an integer of 5 to 200; x is an integer of 1 to 18; y is an integer of 1 to 5; and z is an integer of 1 to 18.

12. The method for producing an electroconductive substrate according to claim 11, wherein the graft copolymer as the dispersant further comprises a constitutional unit represented by the following chemical formula (III):

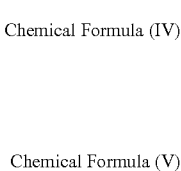

Chemical Formula (III)

wherein $R^{1'''}$ is a hydrogen atom or a methyl group; "A'" is a direct bond or a divalent linking group, and the divalent linking group as "A'" is at least one selected from the group consisting of an alkylene group comprising 1 to 10 carbon atoms, an arylene group, a —CONH— group, a —COO— group, an ether group comprising 1 to 10 carbon atoms comprising the formula —R'''—OR''''— wherein R''' and R'''' are each independently an alkylene group and combinations thereof; and "Q" is a group represented by the following chemical formula (II-a) or a nitrogen-containing heterocyclic group which is able to form a salt with an acid or a halogenated hydrocarbon, and the nitrogen-containing heterocyclic group optionally comprises a substituent group which is at least one selected from the group consisting of a halogen atom, an alkyl group comprising 1 to 12 carbon atoms, an aralkyl group and an aryl group:

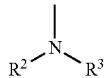

Chemical Formula (III-a)

wherein $R^2$ and $R^3$ are each independently a hydrogen atom or a hydrocarbon group which optionally contains a heteroatom; the hydrocarbon group optionally comprises a substituent group, and the substituent group in $R^2$ and $R^3$ is a halogen atom; and $R^2$ and $R^3$ can be the same as or different from each other.

13. The method for producing an electroconductive substrate according to claim 12, wherein, in the graft copolymer as the dispersant, a salt is formed between at least a part of a nitrogen site contained in the constitutional unit represented by the chemical formula (III) and at least one selected from the group consisting of an acidic phosphorus compound, a sulfonic acid compound and a halogenated hydrocarbon.

14. The method for producing an electroconductive substrate according to claim 13, wherein, in the dispersant, the acidic phosphorus compound is a compound represented by the following chemical formula (VI); the sulfonic acid compound is a compound represented by the following chemical formula (VII); and the halogenated hydrocarbon is one or more selected from the group consisting of a halogenated benzyl, a halogenated allyl and a halogenated methyl:

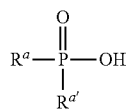

Chemical Formula (VI)

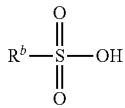

Chemical Formula (VII)

wherein $R^a$ and $R^{a'}$ are each independently a hydrogen atom, a hydroxyl group, a hydrocarbon group optionally comprising a substituent group, or a monovalent group represented by —[CH($R^c$)—CH($R^d$)—O]$_s$—$R^e$, —[(CH$_2$)$_t$—O]$_u$—$R^e$ or —O—$R^{a''}$; $R^{a''}$ is a hydrocarbon group optionally comprising a substituent group, or a monovalent group represented by —[CH($R^c$)—CH($R^d$)—O]$_s$—$R^e$, —[(CH$_2$)$_t$—O]$_u$—$R^e$, —C($R^f$)($R^g$)—C($R^h$)($R^i$)—OH or —CH$_2$—C($R^j$)($R^k$)—CH$_2$—OH;

$R^b$ is a hydrocarbon group optionally comprising a substituent group, or a monovalent group represented by —[CH($R^c$)—CH($R^d$)—O]$_s$—$R^e$, —[(CH$_2$)$_t$—O]$_u$—$R^e$ or —O—$R^{b'}$; $R^{b'}$ is a hydrocarbon group optionally comprising a substituent group, or a monovalent group represented by —[CH($R^c$)—CH($R^d$)—O]$_s$—$R^e$ or —[($CH_2$)$_t$—O]$_u$—$R^e$;

$R^c$ and $R^d$ are each independently a hydrogen atom or a methyl group; $R^e$ is a hydrogen atom, a hydrocarbon group optionally comprising a substituent group, or a monovalent group represented by —CHO, —$CH_2$CHO, —CO—CH=$CH_2$, —CO—C($CH_3$)=$CH_2$ or —$CH_2$COO$R^{e'}$; $R^{e'}$ is a hydrogen atom or an alkyl group comprising 1 to 5 carbon atoms; $R^f$, $R^g$, $R^h$, $R^i$, $R^j$ and $R^k$ are each independently a hydrogen atom, a hydrocarbon group optionally comprising a substituent group, or a group in which hydrocarbon groups optionally comprising a substituent group are bound by at least one of an ether bond and an ester bond, and $R^f$ and $R^h$ can be bound to each other to form a cyclic structure; when the cyclic structure is formed, the cyclic structure optionally comprises a substituent group $R^l$, and $R^l$ is a hydrogen atom, a hydrocarbon group optionally comprising a substituent group, or a group in which hydrocarbon groups optionally comprising a substituent group are bound by at least one of an ether bond and an ester bond;

the substituent group in $R^a$, $R^{a'}$, $R^{a''}$, $R^b$, $R^{b'}$, $R^e$, $R^f$, $R^g$, $R^h$, $R^i$, $R^j$, $R^k$ and $R^l$ is at least one selected from the group consisting of a nitro group and a halogen atom, and when $R^a$, $R^{a'}$, $R^{a''}$, $R^b$, $R^{b'}$, $R^e$, $R^f$, $R^g$, $R^h$, $R^i$, $R^j$, $R^k$ and $R^l$ are each a group comprising an aromatic ring, the aromatic ring optionally comprises a substituent group of an alkyl or alkenyl group;

s is an integer of 1 to 18; t is an integer of 1 to 5; and u is an integer of 1 to 18.

15. The method for producing an electroconductive substrate according to claim 11, wherein the metal particles are metal particles containing one or more selected from the group consisting of gold, silver, copper and oxides thereof.

16. The method for producing an electroconductive substrate according to claim 11, wherein the baking step is a step of baking the coating film by irradiation with pulsed light.

* * * * *